US011269509B2

(12) United States Patent
Sepehr et al.

(10) Patent No.: US 11,269,509 B2
(45) Date of Patent: *Mar. 8, 2022

(54) FORCE SENSING SYSTEM AND METHOD

(71) Applicant: Cirrus Logic International Semiconductor Ltd., Edinburgh (GB)

(72) Inventors: Hamid Sepehr, London (GB); Pablo Peso Parada, Maidenhead (GB); Willem Zwart, Edinburgh (GB); Tom Birchall, London (GB); Michael Allen Kost, Cedar Park, TX (US); Tejasvi Das, Austin, TX (US); Siddharth Maru, Austin, TX (US); Matthew Beardsworth, Austin, TX (US); Bruce E. Duewer, Round Rock, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/076,489

(22) Filed: Oct. 21, 2020

(65) Prior Publication Data

US 2021/0034213 A1 Feb. 4, 2021

Related U.S. Application Data

(63) Continuation of application No. 16/422,543, filed on May 24, 2019, now Pat. No. 10,860,202.

(Continued)

(30) Foreign Application Priority Data

Oct. 26, 2018 (GB) ...................................... 1817495

(51) Int. Cl.
*G06F 3/0488* (2013.01)
*G06F 3/041* (2006.01)
(Continued)

(52) U.S. Cl.
CPC .......... *G06F 3/0488* (2013.01); *G06F 3/0412* (2013.01); *G06F 3/0414* (2013.01);
(Continued)

(58) Field of Classification Search
CPC ....................... H04M 2250/22; G06F 3/0488; G06F 3/0412; G06F 3/0414; G06F 2203/04105;
(Continued)

(56) References Cited

U.S. PATENT DOCUMENTS 3,686,927 A 8/1972 Scharton
4,902,136 A 2/1990 Mueller et al.
(Continued)

FOREIGN PATENT DOCUMENTS

AU 2002347829 4/2003
CN 103165328 A 6/2013
(Continued)

OTHER PUBLICATIONS

First Examination Opinion Notice, State Intellectual Property Office of the People's Republic of China, Application No. 201880037435. X, dated Dec. 31, 2020.
(Continued)

*Primary Examiner* — Kenneth B Lee, Jr.
(74) *Attorney, Agent, or Firm* — Jackson Walker L.L.P.

(57) ABSTRACT

A force sensing system for determining if a user input has occurred, the system comprising: an input channel, to receive an input from at least one force sensor; an activity detection stage, to monitor an activity level of the input from the at least one force sensor and, responsive to an activity level which may be indicative of a user input being reached, to generate an indication that an activity has occurred at the force sensor; and an event detection stage to receive said
(Continued)

indication, and to determine if a user input has occurred based on the received input from the at least one force sensor.

20 Claims, 17 Drawing Sheets

Related U.S. Application Data

(60) Provisional application No. 62/842,821, filed on May 3, 2019.

(51) Int. Cl.
*G01L 5/162* (2020.01)
*G01L 5/165* (2020.01)
*G01L 5/167* (2020.01)
*G01L 5/164* (2020.01)

(52) U.S. Cl.
CPC ............. *G01L 5/162* (2013.01); *G01L 5/164* (2013.01); *G01L 5/165* (2013.01); *G01L 5/167* (2013.01); *G06F 2203/04105* (2013.01); *H04M 2250/22* (2013.01)

(58) Field of Classification Search
CPC ......... G01L 5/162; G01L 5/164; G01L 5/165; G01L 5/167
See application file for complete search history.

(56) References Cited

U.S. PATENT DOCUMENTS

| | | |
|---|---|---|
| 5,684,722 A | 11/1997 | Thorner et al. |
| 5,748,578 A | 5/1998 | Schell |
| 5,857,986 A | 1/1999 | Moriyasu |
| 6,050,393 A | 4/2000 | Murai et al. |
| 6,278,790 B1 | 8/2001 | Davis et al. |
| 6,332,029 B1 | 12/2001 | Azima et al. |
| 6,388,520 B2 | 5/2002 | Wada et al. |
| 6,567,478 B2 | 5/2003 | Oishi et al. |
| 6,580,796 B1 | 6/2003 | Kuroki |
| 6,683,437 B2 | 1/2004 | Tierling |
| 6,703,550 B2 | 3/2004 | Chu |
| 6,762,745 B1 | 7/2004 | Braun et al. |
| 6,768,779 B1 | 7/2004 | Nielsen |
| 6,784,740 B1 | 8/2004 | Tabatabaei |
| 6,906,697 B2 | 6/2005 | Rosenberg |
| 6,995,747 B2 | 2/2006 | Casebolt et al. |
| 7,154,470 B2 | 12/2006 | Tierling |
| 7,277,678 B2 | 10/2007 | Rozenblit et al. |
| 7,333,604 B2 | 2/2008 | Zernovizky et al. |
| 7,392,066 B2 | 6/2008 | Haparnas |
| 7,456,688 B2 | 11/2008 | Okazaki et al. |
| 7,623,114 B2 | 11/2009 | Rank |
| 7,639,232 B2 | 12/2009 | Grant et al. |
| 7,791,588 B2 | 9/2010 | Tierling et al. |
| 7,979,146 B2 | 7/2011 | Ullrich et al. |
| 8,068,025 B2 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,441,444 B2 | 5/2013 | Moore et al. |
| 8,466,778 B2 | 6/2013 | Hwang et al. |
| 8,480,240 B2 | 7/2013 | Kashiyama |
| 8,572,293 B2 | 10/2013 | Cruz-Hernandez et al. |
| 8,572,296 B2 | 10/2013 | Shasha et al. |
| 8,593,269 B2 | 11/2013 | Grant et al. |
| 8,648,829 B2 | 2/2014 | Shahoian et al. |
| 8,659,208 B1 | 2/2014 | Rose et al. |
| 8,754,757 B1 | 6/2014 | Ullrich et al. |
| 8,947,216 B2 | 2/2015 | Da Costa et al. |
| 8,981,915 B2 | 3/2015 | Birnbaum et al. |
| 8,994,518 B2 | 3/2015 | Gregorio et al. |
| 9,030,428 B2 | 5/2015 | Fleming |
| 9,063,570 B2 | 6/2015 | Weddle et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,326,066 B2 | 4/2016 | Klippel |
| 9,329,721 B1 | 5/2016 | Buuck et al. |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,495,013 B2 | 11/2016 | Underkoffler et al. |
| 9,507,423 B2 | 11/2016 | Gandhi et al. |
| 9,513,709 B2 | 12/2016 | Gregorio et al. |
| 9,520,036 B1 | 12/2016 | Buuck |
| 9,588,586 B2 | 3/2017 | Rihn |
| 9,640,047 B2 | 5/2017 | Choi et al. |
| 9,652,041 B2 | 5/2017 | Jiang et al. |
| 9,696,859 B1 | 7/2017 | Heller et al. |
| 9,697,450 B1 | 7/2017 | Lee |
| 9,715,300 B2 | 7/2017 | Sinclair et al. |
| 9,740,381 B1 | 8/2017 | Chaudhri et al. |
| 9,842,476 B2 | 12/2017 | Rihn et al. |
| 9,864,567 B2 | 1/2018 | Seo |
| 9,881,467 B2 | 1/2018 | Levesque |
| 9,886,829 B2 | 2/2018 | Levesque |
| 9,946,348 B2 | 4/2018 | Ullrich et al. |
| 9,947,186 B2 | 4/2018 | Macours |
| 9,959,744 B2 | 5/2018 | Koskan et al. |
| 9,965,092 B2 | 5/2018 | Smith |
| 10,032,550 B1 | 7/2018 | Zhang et al. |
| 10,055,950 B2 | 8/2018 | Saboune et al. |
| 10,074,246 B2 | 9/2018 | Da Costa et al. |
| 10,110,152 B1 | 10/2018 | Hajati |
| 10,171,008 B2 | 1/2019 | Nishitani et al. |
| 10,175,763 B2 | 1/2019 | Shah |
| 10,264,348 B1 | 4/2019 | Harris et al. |
| 10,564,727 B2 | 2/2020 | Billington et al. |
| 10,620,704 B2 | 4/2020 | Rand et al. |
| 10,667,051 B2 | 5/2020 | Stahl |
| 10,726,638 B2 | 7/2020 | Mondello et al. |
| 10,782,785 B2 | 9/2020 | Hu et al. |
| 10,795,443 B2 | 10/2020 | Hu et al. |
| 10,820,100 B2 | 10/2020 | Stahl et al. |
| 10,828,672 B2 | 11/2020 | Stahl et al. |
| 10,832,537 B2 | 11/2020 | Doy et al. |
| 10,848,886 B2 | 11/2020 | Rand |
| 10,860,202 B2 * | 12/2020 | Sepehr .................. G06F 3/0488 |
| 10,969,871 B2 | 4/2021 | Rand et al. |
| 2001/0043714 A1 | 11/2001 | Asada et al. |
| 2002/0018578 A1 | 2/2002 | Burton |
| 2002/0085647 A1 | 7/2002 | Oishi et al. |
| 2003/0068053 A1 | 4/2003 | Chu |
| 2003/0214485 A1 | 11/2003 | Roberts |
| 2005/0031140 A1 | 2/2005 | Browning |
| 2005/0134562 A1 | 6/2005 | Grant et al. |
| 2006/0028095 A1 | 2/2006 | Maruyama et al. |
| 2006/0197753 A1 | 9/2006 | Hotelling |
| 2007/0241816 A1 | 10/2007 | Okazaki et al. |
| 2008/0077367 A1 | 3/2008 | Odajima |
| 2008/0226109 A1 | 9/2008 | Yamakata et al. |
| 2008/0240458 A1 | 10/2008 | Goldstein et al. |
| 2008/0293453 A1 | 11/2008 | Atlas et al. |
| 2008/0316181 A1 | 12/2008 | Nurmi |
| 2009/0020343 A1 | 1/2009 | Rothkopf et al. |
| 2009/0079690 A1 | 3/2009 | Watson et al. |
| 2009/0088220 A1 | 4/2009 | Persson |
| 2009/0096632 A1 | 4/2009 | Ullrich et al. |
| 2009/0102805 A1 | 4/2009 | Meijer et al. |
| 2009/0128306 A1 | 5/2009 | Luden et al. |
| 2009/0153499 A1 | 6/2009 | Kim et al. |
| 2009/0278819 A1 | 11/2009 | Goldenberg et al. |
| 2010/0013761 A1 | 1/2010 | Birnbaum et al. |
| 2010/0085317 A1 | 4/2010 | Park et al. |
| 2010/0141408 A1 | 6/2010 | Doy et al. |
| 2010/0141606 A1 | 6/2010 | Bae et al. |

(56) References Cited

U.S. PATENT DOCUMENTS

| | | |
|---|---|---|
| 2010/0260371 A1 | 10/2010 | Afshar |
| 2010/0261526 A1 | 10/2010 | Anderson et al. |
| 2011/0056763 A1 | 3/2011 | Tanase et al. |
| 2011/0075835 A1 | 3/2011 | Hill |
| 2011/0141052 A1 | 6/2011 | Bernstein et al. |
| 2011/0161537 A1 | 6/2011 | Chang |
| 2011/0163985 A1 | 7/2011 | Bae et al. |
| 2011/0167391 A1 | 7/2011 | Momeyer et al. |
| 2012/0011436 A1 | 1/2012 | Jinkinson et al. |
| 2012/0105358 A1 | 5/2012 | Momeyer et al. |
| 2012/0112894 A1 | 5/2012 | Yang et al. |
| 2012/0206246 A1 | 8/2012 | Cruz-Hernandez et al. |
| 2012/0206247 A1 | 8/2012 | Bhatia et al. |
| 2012/0229264 A1 | 9/2012 | Company Bosch et al. |
| 2012/0253698 A1 | 10/2012 | Cokonaj |
| 2012/0306631 A1 | 12/2012 | Hughes |
| 2013/0016855 A1 | 1/2013 | Lee et al. |
| 2013/0027359 A1 | 1/2013 | Schevin et al. |
| 2013/0038792 A1 | 2/2013 | Quigley et al. |
| 2013/0096849 A1 | 4/2013 | Campbell et al. |
| 2013/0141382 A1 | 6/2013 | Simmons et al. |
| 2013/0275058 A1 | 10/2013 | Awad |
| 2013/0289994 A1 | 10/2013 | Newman et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0085064 A1 | 3/2014 | Crawley et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0139327 A1 | 5/2014 | Bau et al. |
| 2014/0226068 A1 | 8/2014 | Lacroix et al. |
| 2014/0292501 A1 | 10/2014 | Lim et al. |
| 2014/0340209 A1 | 11/2014 | Lacroix et al. |
| 2014/0347176 A1 | 11/2014 | Modarres et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070260 A1 | 3/2015 | Saboune et al. |
| 2015/0084752 A1 | 3/2015 | Heubel et al. |
| 2015/0130767 A1 | 5/2015 | Myers et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0324116 A1 | 11/2015 | Marsden et al. |
| 2015/0325116 A1 | 11/2015 | Umminger, III |
| 2015/0341714 A1 | 11/2015 | Ahn et al. |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070392 A1 | 3/2016 | Wang et al. |
| 2016/0074278 A1 | 3/2016 | Muench et al. |
| 2016/0132118 A1 | 5/2016 | Park et al. |
| 2016/0162031 A1 | 6/2016 | Westerman et al. |
| 2016/0179203 A1 | 6/2016 | Modarres et al. |
| 2016/0239089 A1 | 8/2016 | Taninaka et al. |
| 2016/0246378 A1 | 8/2016 | Sampanes et al. |
| 2016/0291731 A1 | 10/2016 | Liu et al. |
| 2016/0358605 A1 | 12/2016 | Ganong, III et al. |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0153760 A1 | 6/2017 | Chawda et al. |
| 2017/0168574 A1 | 6/2017 | Zhang |
| 2017/0169674 A1 | 6/2017 | Macours |
| 2017/0220197 A1 | 8/2017 | Matsumoto et al. |
| 2017/0256145 A1 | 9/2017 | Macours et al. |
| 2017/0277350 A1 | 9/2017 | Wang et al. |
| 2017/0357440 A1 | 12/2017 | Tse |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1 | 3/2018 | Tzanetos |
| 2018/0084362 A1 | 3/2018 | Zhang et al. |
| 2018/0151036 A1 | 5/2018 | Cha et al. |
| 2018/0158289 A1 | 6/2018 | Vasilev et al. |
| 2018/0159457 A1 | 6/2018 | Eke |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0196567 A1 | 7/2018 | Klein et al. |
| 2018/0237033 A1 | 8/2018 | Hakeem et al. |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0294757 A1 | 10/2018 | Feng et al. |
| 2018/0301060 A1 | 10/2018 | Israr et al. |
| 2018/0321748 A1 | 11/2018 | Rao et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0227628 A1 | 1/2019 | Rand et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0294247 A1 | 9/2019 | Hu et al. |
| 2019/0296674 A1 | 9/2019 | Janko et al. |
| 2019/0297418 A1 | 9/2019 | Stahl |
| 2019/0311590 A1 | 10/2019 | Doy et al. |
| 2019/0341903 A1 | 11/2019 | Kim |
| 2020/0117506 A1 | 4/2020 | Chan |
| 2020/0218352 A1 | 7/2020 | Macours et al. |
| 2020/0313654 A1 | 10/2020 | Marchais et al. |
| 2021/0108975 A1 | 4/2021 | Peso Parada et al. |
| 2021/0157436 A1 | 5/2021 | Peso Parada et al. |
| 2021/0174777 A1 | 6/2021 | Marchais et al. |
| 2021/0175869 A1 | 6/2021 | Taipale |
| 2021/0365118 A1 | 11/2021 | Rajapurkar et al. |

FOREIGN PATENT DOCUMENTS

| | | |
|---|---|---|
| CN | 103403796 A | 11/2013 |
| CN | 204903757 U | 12/2015 |
| CN | 105264551 A | 1/2016 |
| CN | 106438890 A | 2/2017 |
| CN | 106950832 A | 7/2017 |
| CN | 107665051 A | 2/2018 |
| EP | 0784844 B1 | 6/2005 |
| EP | 2363785 A1 | 9/2011 |
| EP | 2487780 A1 | 8/2012 |
| EP | 2600225 A1 | 6/2013 |
| EP | 2846218 A1 | 3/2015 |
| EP | 2846229 A2 | 3/2015 |
| EP | 2846329 A1 | 3/2015 |
| EP | 2988528 A1 | 2/2016 |
| EP | 3125508 A1 | 2/2017 |
| EP | 3379382 A1 | 9/2018 |
| GB | 201620746 A | 1/2017 |
| IN | 201747044027 | 8/2018 |
| JP | H02130433 B2 | 5/1990 |
| JP | 08149006 A | 6/1996 |
| JP | 6026751 B2 | 11/2016 |
| JP | 6250985 | 12/2017 |
| JP | 6321351 | 5/2018 |
| KR | 20120126446 A | 11/2012 |
| WO | 2013104919 A1 | 7/2013 |
| WO | 2013186845 A1 | 12/2013 |
| WO | 2014018086 A1 | 1/2014 |

(56) References Cited

FOREIGN PATENT DOCUMENTS

| WO | 2014094283 A1 | 6/2014 |
| WO | 2016105496 A1 | 6/2016 |
| WO | 2016164193 A1 | 10/2016 |
| WO | 2017113651 A1 | 7/2017 |
| WO | 2018053159 A1 | 3/2018 |
| WO | 2018067613 A1 | 4/2018 |
| WO | 2018125347 A1 | 7/2018 |
| WO | 2020004840 A1 | 1/2020 |
| WO | 2020055405 A1 | 3/2020 |

OTHER PUBLICATIONS

International Search Report and Written Opinion of the International Searching Authority, International Application No. PCT/GB2019/050964, dated Sep. 3, 2019.

International Search Report and Written Opinion of the International Searching Authority, International Application No. PCT/GB2019/050770, dated Jul. 5, 2019.

Communication Relating to the Results of the Partial International Search, and Provisional Opinion Accompanying the Partial Search Result, of the International Searching Authority, International Application No. PCT/US2018/031329, dated Jul. 20, 2018.

Combined Search and Examination Report, UKIPO, Application No. GB1720424.9, dated Jun. 5, 2018.

International Search Report and Written Opinion of the International Searching Authority, International Application No. PCT/GB2019/052991, dated Mar. 17, 2020, received by Applicant Mar. 19, 2020.

Communication Relating to the Results of the Partial International Search, and Provisional Opinion Accompanying the Partial Search Result, of the International Searching Authority, International Application No. PCT/GB2020/050822, dated Jul. 9, 2020.

International Search Report and Written Opinion of the International Searching Authority, International Application No. PCT/US2020/024864, dated Jul. 6, 2020.

International Search Report and Written Opinion of the International Searching Authority, International Application No. PCT/GB2020/051035, dated Jul. 10, 2020.

International Search Report and Written Opinion of the International Searching Authority, International Application No. PCT/GB2020/050823, dated Jun. 30, 2020.

International Search Report and Written Opinion of the International Searching Authority, International Application No. PCT/GB2020/051037, dated Jul. 9, 2020.

International Search Report and Written Opinion of the International Searching Authority, International Application No. PCT/GB2020/050822, dated Aug. 31, 2020.

International Search Report and Written Opinion of the International Searching Authority, International Application No. PCT/GB2020/051438, dated Sep. 28, 2020.

Office Action of the Intellectual Property Office, ROC (Taiwan) Patent Application No. 107115475, dated Apr. 30, 2021.

First Office Action, China National Intellectual Property Administration, Patent Application No. 2019800208570, dated Jun. 3, 2021.

Invitation to Pay Additional Fees, Partial International Search Report and Provisional Opinion of the International Searching Authority, International Application No. PCT/US2020/052537, dated Jan. 14, 2021.

International Search Report and Written Opinion of the International Searching Authority, International Application No. PCT/US2020/056610, dated Jan. 21, 2021.

International Search Report and Written Opinion of the International Searching Authority, International Application No. PCT/GB2020/052537, dated Mar. 9, 2021.

International Search Report and Written Opinion of the International Searching Authority, International Application No. PCT/US2021/021908, dated Jun. 9, 2021.

Notice of Preliminary Rejection, Korean Intellectual Property Office, Application No. 10-2019-7036236, dated Jun. 29, 2021.

Combined Search and Examination Report, United Kingdom Intellectual Property Office, Application No. GB2018051.9, dated Jun. 30, 2021.

Communication pursuant to Rule 164(2)(b) and Article 94(3) EPC, European Patent Office, Application No. 18727512.8, dated Jul. 8, 2021.

Gottfried Behler: "Measuring the Loudspeaker's Impedance during Operation for the Derivation of the Voice Coil Temperature", AES Convention Preprint, Feb. 25, 1995 (Feb. 25, 1995), Paris.

First Office Action, China National Intellectual Property Administration, Patent Application No. 2019800211287, dated Jul. 5, 2021.

Steinbach et al., Haptic Data Compression and Communication, IEEE Signal Processing Magazine, Jan. 2011.

Pezent et al., Syntacts Open-Source Software and Hardware for Audio-Controlled Haptics, IEEE Transactions on Haptics, vol. 14, No. 1, Jan.-Mar. 2021.

Examination Report under Section 18(3), United Kingdom Intellectual Property Office, Application No. GB2018051.9, dated Nov. 5, 2021.

Final Notice of Preliminary Rejection, Korean Patent Office, Application No. 10-2019-7036236, dated Nov. 29, 2021.

Examination Report under Section 18(3), United Kingdom Intellectual Property Office, Application No. GB2018050.1, dated Dec. 22, 2021.

\* cited by examiner

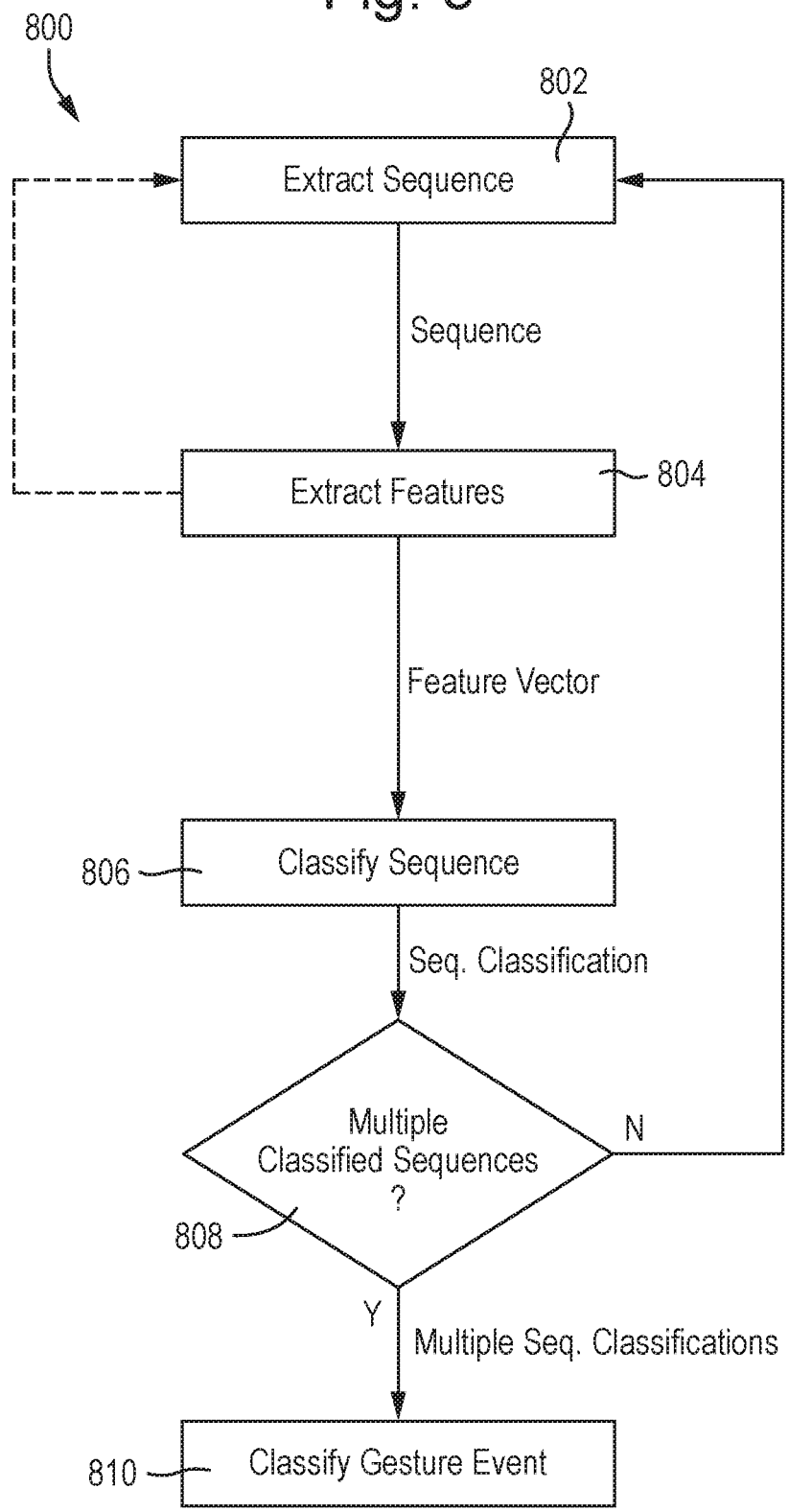

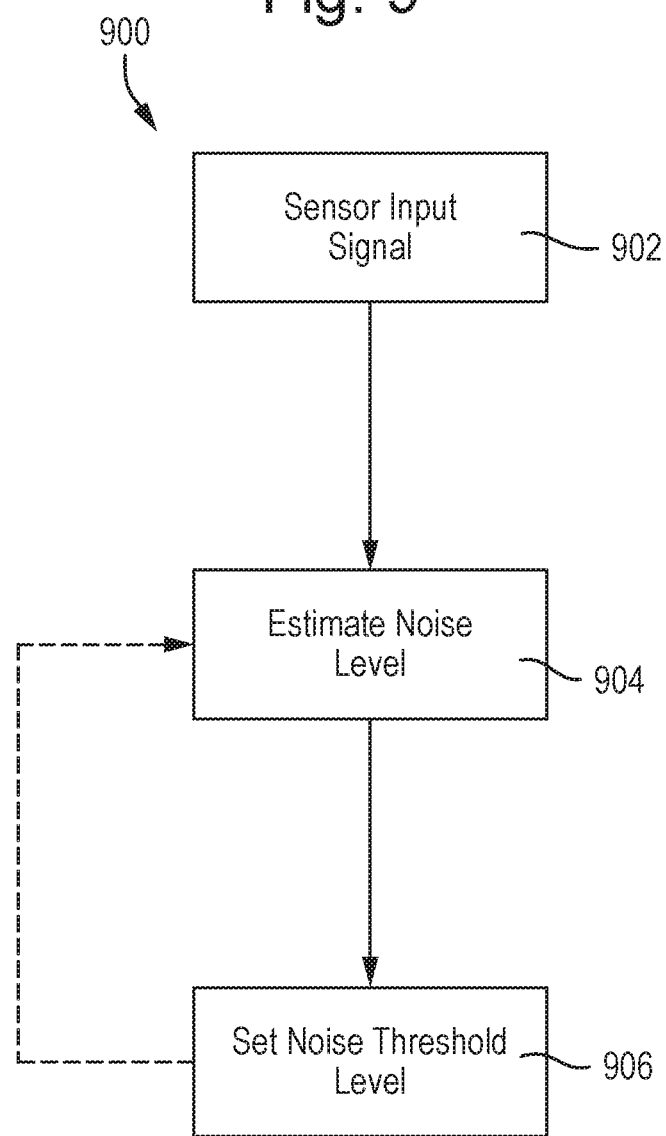

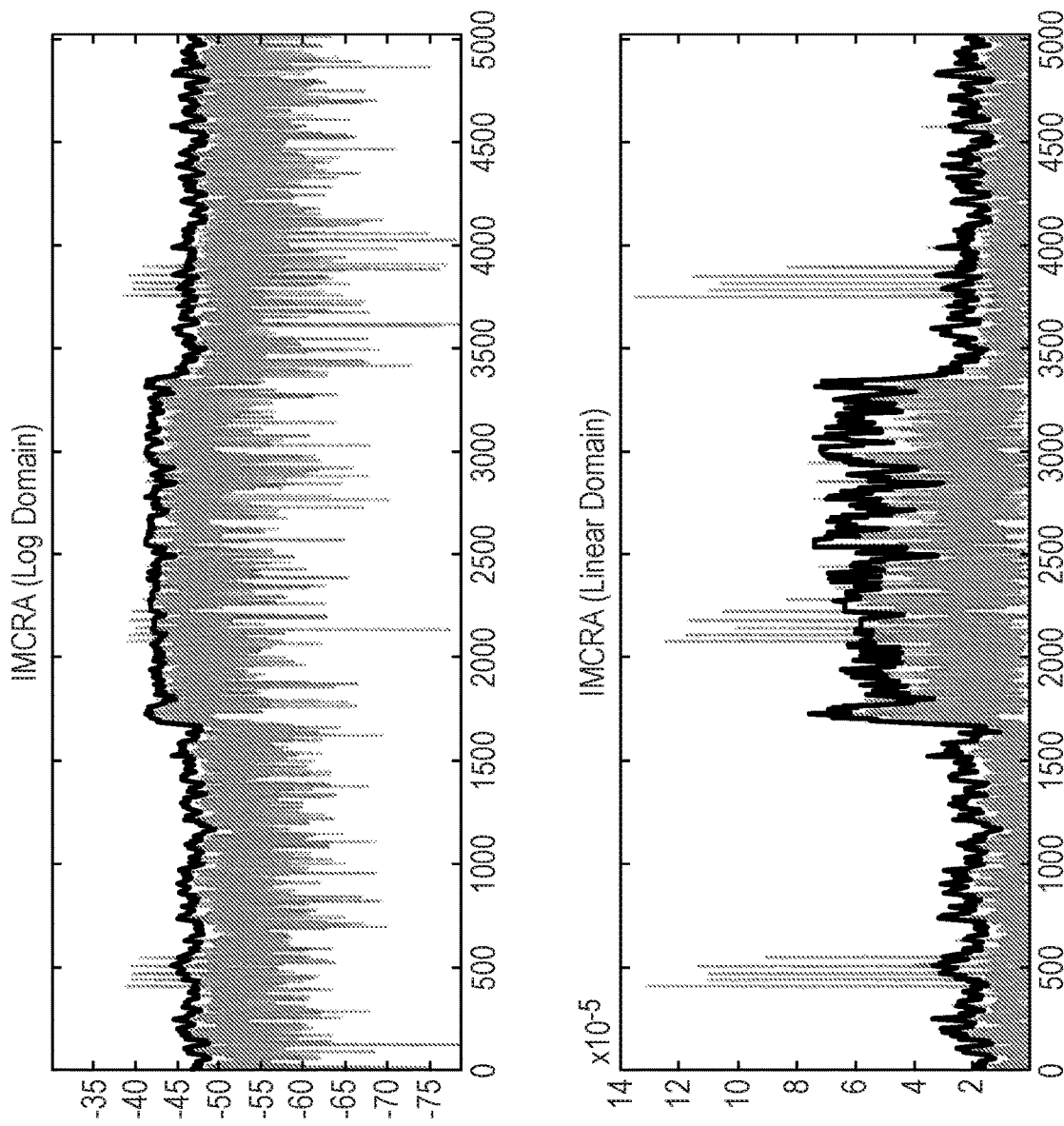

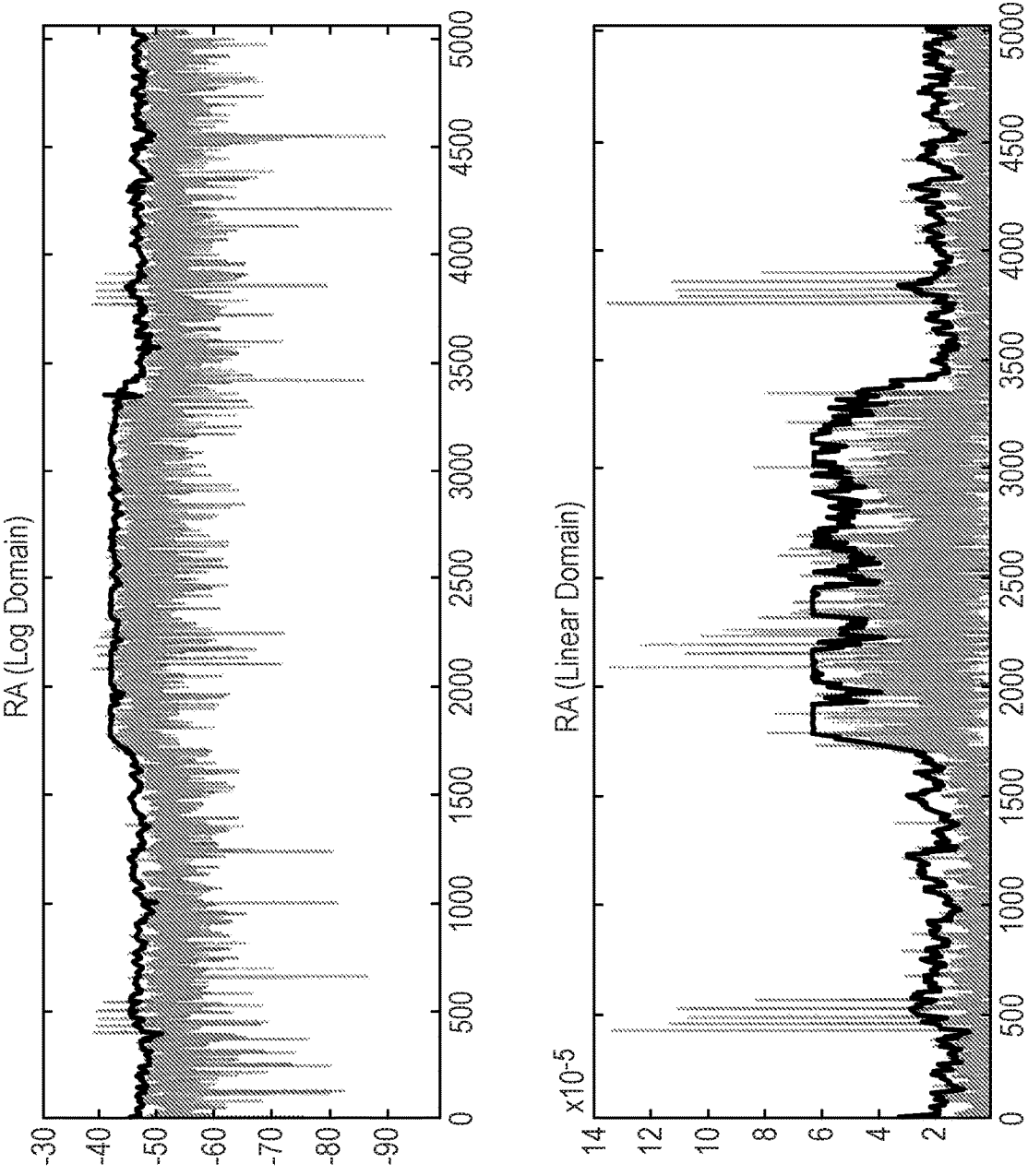

Fig. 11
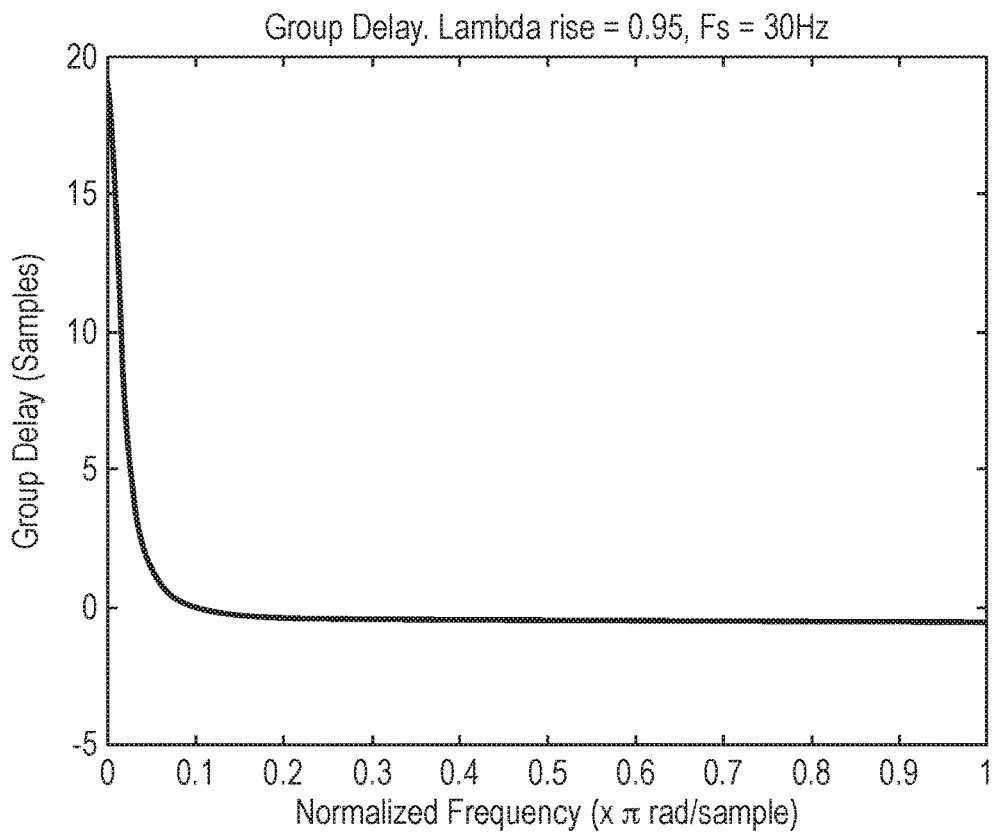
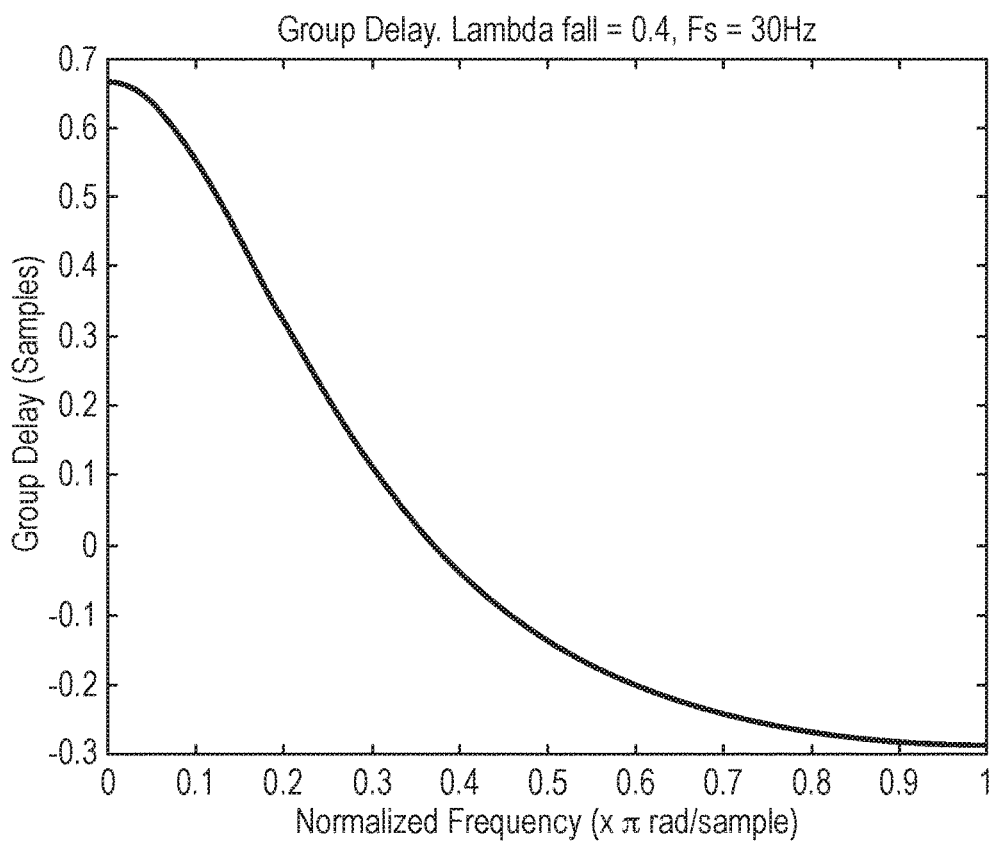

FORCE SENSING SYSTEM AND METHOD

This application is a continuation of U.S. patent application Ser. No. 16/422,543, filed May 24, 2019, which claims priority to U.S. Provisional Patent Application Ser. No. 62/842,821, filed May 3, 2019, and United Kingdom Patent Application No. 1817495.3, filed Oct. 26, 2018, each of which is incorporated by reference herein in its entirety.

FIELD OF THE INVENTION

The present invention relates to a system and method for a force sensing device.

In general such a system and method may be implemented in a controller of the device, the device comprising one or more force sensors. The present disclosure relates to the controller and to the device comprising the controller, as well as to corresponding methods and computer programs. Such a device may be a portable electrical or electronic device.

Thus, the present disclosure relates in general to a sensor system which may form part or all of electronic devices with user interfaces, (e.g., mobile devices, game controllers, instrument panels, etc.).

BACKGROUND OF THE INVENTION

Force sensors are known as possible input devices for electronic systems, and can be used as an alternative to traditional mechanical switches.

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices to be waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

Force sensors thus detect forces on the device to determine user interaction, e.g. touches, presses, or squeezes of the device. There is a need to provide systems to process the output of such sensors which balances low power consumption with responsive performance. There is a need in the industry for sensors to detect user interaction with a human-machine interface, wherein such sensors and related sensor systems provide acceptable levels of sensor sensitivity, power consumption, and size.

DESCRIPTION OF THE INVENTION

Accordingly, in an aspect of the invention and with reference to the attached FIG. 2 (described in more detail later), there is provided a force sensing system for determining if a user input has occurred, the system comprising:

An input channel, to receive an input from at least one force sensor;

An activity detection stage, to monitor an activity level of the input from the at least one force sensor and, responsive to an activity level which may be indicative of a user input being reached, to generate an indication that an activity has occurred at the force sensor; and An event detection stage to receive said indication, and to determine if a user input has occurred based on the received input from the at least one force sensor.

Such a force sensing system can be provided as a relatively low-power, always-on module which can provide an input to a relatively high-power central processing unit or applications processor. The event detection stage may be power-gated by the output of the activity detection stage. By utilising an activity detection stage in combination with an event detection stage, accordingly the power consumption of the system can be minimised for always-on operation.

Force Sensors

Preferably, the system further comprises:

At least one force sensor, the output of the at least one force sensor coupled to the input channel to provide the received input.

Preferably, the at least one force sensor comprises one or more of the following:

A capacitive displacement sensor;
An inductive force sensor;
A strain gauge;
A piezoelectric force sensor;
A force sensing resistor;
A piezoresistive force sensor;
A thin film force sensor; and
A quantum tunnelling composite-based force sensor.

Input Channel

Preferably, the input channel is arranged to provide at least one of the following:

Gain control adjustment of the input from the at least one force sensor;
Bias voltage adjustment of the input from the at least one force sensor;
Duty cycling of the at least one force sensor;
Sensitivity adjustment of the at least one force sensor;
Polarity adjustment of the at least one force sensor; and
Offset adjustment of the at least one force sensor.

Sensor Conditioning

Preferably, the system further comprises:

A sensor conditioning stage, to perform conditioning of an input received from the input channel to provide a conditioned force sense signal, wherein the activity detection stage performs the activity level monitoring on the conditioned force sense signal.

Preferably, the sensor conditioning stage is configured to perform a normalisation of the input received from the input channel. The normalisation may be based on predefined calibration parameters for the system, and/or based on dynamically-updated calibration parameters.

Preferably, the sensor conditioning stage is configured to perform a filtering of the input received from the input channel, for noise rejection. Preferably, the filtering comprises applying a low-pass filter to the input received from the input channel. Preferably, the low pass filter is configured to have a low latency.

Preferably, the sensor conditioning stage is configured to perform a baseline tracking of the input received from the input channel. Preferably, the sensor conditioning is configured to allow for adjustable time constants for the baseline tracking.

Where the system is configured to receive inputs from multiple force sensors, preferably the sensor conditioning stage is configured to determine an inverse correlation matrix of the inputs received from the input channel, to determine a sensor diagonalization of the inputs received from the input channel.

It will be understood that the sensor conditioning stage may comprise some or all of the above-described elements, to provide the conditioned force sense signal.

Activity Detection

Preferably, the activity detection stage comprises a thresholding module, the thresholding module configured to determine if the activity level of the input from the at least one force sensor or of the conditioned force sense signal exceeds at least one threshold, wherein if the activity level exceeds the at least one threshold the activity detection stage determines that an activity has occurred at the force sensor.

Preferably, the thresholding module is configured to monitor a signal received by the activity detection stage, and to compare the power level of the monitored signal against a power level threshold indicative of an activity occurring at the sensor.

Preferably, the system further comprises a feature extraction module configured to extract features from a monitored signal, the monitored signal comprising the input from the at least one force sensor or the conditioned force sense signal.

Preferably, the feature extraction module is configured to extract at least one of the following from the monitored signal:
  the rate or rise and/or fall of the monitored signal;
  the active duration of the monitored signal; and
  defined classifier parameters of the monitored signal, e.g. bias values.

Preferably, the thresholding module is further configured to perform at least one of the following:
  compare the rate or rise and/or fall of the monitored signal against a corresponding rise threshold and/or a fall threshold indicative of an activity occurring at the sensor;
  compare an active duration of the monitored signal against a minimum and/or maximum duration threshold indicative of an activity occurring at the sensor; and
  compare the monitored signal against defined classified parameters to determine whether an activity has occurred at the sensor.

Preferably, the feature extraction module is power gated by the thresholding module, such that the feature extraction module is enabled if the power level of the monitored signal exceeds a power level threshold indicative of an activity occurring at the sensor.

Preferably, the indication generated by the activity detection stage and received by the event detection stage comprises:
  A signal that an activity has occurred and/or at least one output of the feature extraction module.

Event Detection

Preferably, the event detection stage comprises a comparison stage arranged to compare the received indication against a stored touch event model, and to determine if a user input has occurred based on the comparison.

Preferably, the event detection stage is arranged to output an indication that a user input has been detected by the event detection stage.

Preferably, the event detection stage is configured to detect the type of user input that has occurred, by comparison of the received indication with a stored touch event model, to distinguish between:
  A tap event (e.g. greater than ¼ second duration and less than ½ second duration);
  A press event (e.g. greater than ½ second duration);
  wherein the event detection stage is arranged to output an indication of the type of user input that has been detected.

Calibration/Diagnostics

Preferably, the system further comprises a calibration and diagnostics stage which is configured to receive the output of the input channel and/or the output of the sensor conditioning stage and to determine if a recalibration of the system is required.

Preferably, the calibration and diagnostics stage is configured to generate a system output if a recalibration of the system is required. Preferably, the system output is provided as a system interrupt for transmission to a central controller or processing unit which may be coupled with the system.

Device

There is further provided a device comprising the force sensing system as described above. The device may comprise any suitable electronic device, e.g. a mobile phone or tablet device. The force sensing system is preferably provided coupled with an applications processor or central processing unit of any such device.

Input Path

In a further aspect of the invention, it will be understood that the force sensing system is provided with a configurable input path from the force sensors to the components of the force sensing system. In a preferred aspect, the mode of operation of the input path may be different depending on whether the system or module is performing activity detection or event detection. The signal path between the force sensors and the appropriate modules may be switched to allow for considerations of power consumption, latency, etc. For example, when performing event detection the input path can be configured in such a way to conserve power consumption, but which may result in a degradation in the Signal to Noise ratio.

Method

There is further provided a force sensing method, the method comprising the following steps:
  receiving an input from at least one force sensor;
  monitoring an activity level of the input from the at least one force sensor and, responsive to an activity level which may be indicative of a user input being reached, to generating an indication that an activity has occurred at the force sensor; and
  determining if a user input has occurred based on the received input from the at least one force sensor.

Preferably, the method further comprises the step of:
  conditioning the input received from the input channel to provide a conditioned force sense signal, wherein the step of activity level monitoring is performed on the conditioned force sense signal.

It will be understood that the above-described features of the force sensing system may be provided as further method steps.

Further statements defining aspects of the present invention and related optional features are provided at the end of the description.

BRIEF DESCRIPTION OF THE DRAWINGS

Reference will now be made, by way of example only, to the accompanying drawings, of which:

FIG. 8 is a flowchart presenting an example method of event detection;

FIG. 9 is a flowchart presenting an example method of adaptive threshold determination;

FIG. 10 shows a series of graphs of results where first and second example methods of adaptive threshold determination were tested;

FIG. 11 relates to an estimate of the response time of the noise estimation relating to the first example method of adaptive threshold determination;

DETAILED DESCRIPTION

Device

Figure 1:
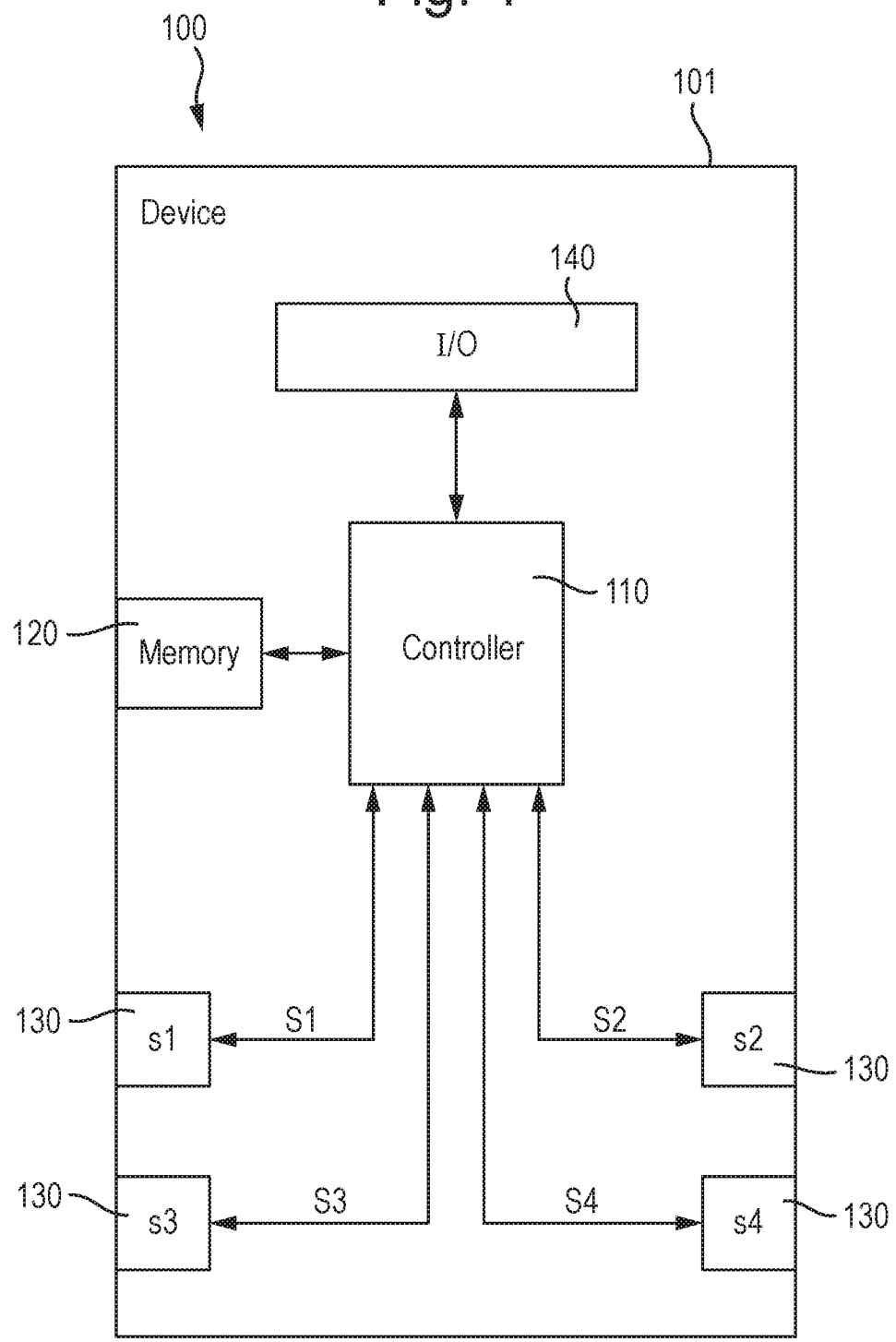
FIG. 1 is a schematic diagram of a device according to an embodiment.

FIG. 1 is a schematic diagram of a device 100 according to an embodiment, for example a mobile or portable electrical or electronic device. Example devices 100 include a portable and/or battery powered host device such as a mobile telephone, a smartphone, an audio player, a video player, a PDA, a mobile computing platform such as a laptop computer or tablet and/or a games device.

As shown in FIG. 1, the device 100 may comprise an enclosure 101, a controller 110, a memory 120, a plurality of force sensors 130, and an input and/or output unit (I/O unit) 140.

The enclosure 101 may comprise any suitable housing, casing, frame or other enclosure for housing the various components of device 100. Enclosure 101 may be constructed from plastic, metal, and/or any other suitable materials. In addition, enclosure 101 may be adapted (e.g., sized and shaped) such that device 100 is readily transported by a user (i.e. a person).

Controller 110 may be housed within enclosure 101 and may include any system, device, or apparatus configured to control functionality of the device 100, including any or all of the memory 120, the force sensors 130, and the I/O unit 140. Controller 110 may be implemented as digital or analogue circuitry, in hardware or in software running on a processor, or in any combination of these.

Thus controller 110 may include any system, device, or apparatus configured to interpret and/or execute program instructions or code and/or process data, and may include, without limitation a processor, microprocessor, microcontroller, digital signal processor (DSP), application specific integrated circuit (ASIC), FPGA (Field Programmable Gate Array) or any other digital or analogue circuitry configured to interpret and/or execute program instructions and/or process data. Thus the code may comprise program code or microcode or, for example, code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL. As the skilled person will appreciate, the code may be distributed between a plurality of coupled components in communication with one another. Where appropriate, such aspects may also be implemented using code running on a field-(re)programmable analogue array or similar device in order to configure analogue hardware. Processor control code for execution by the controller 110, may be provided on a non-volatile carrier medium such as a disk, CD- or DVD-ROM, programmed memory such as read only memory (Firmware), or on a data carrier such as an optical or electrical signal carrier. The controller 110 may be referred to as control circuitry and may be provided as, or as part of, an integrated circuit such as an IC chip.

Memory 120 may be housed within enclosure 101, may be communicatively coupled to controller 110, and may include any system, device, or apparatus configured to retain program instructions and/or data for a period of time (e.g., computer-readable media). In some embodiments, controller 110 interprets and/or executes program instructions and/or processes data stored in memory 120 and/or other computer-readable media accessible to controller 110.

The force sensors 130 may be housed within, be located on or form part of the enclosure 101, and may be communicatively coupled to the controller 110. Each force sensor 130 may include any suitable system, device, or apparatus for sensing a force, a pressure, or a touch (e.g., an interaction with a human finger) and for generating an electrical or electronic signal in response to such force, pressure, or touch. Example force sensors 130 include or comprise capacitive displacement sensors, inductive force sensors, strain gauges, piezoelectric force sensors, force sensing resistors, piezoresistive force sensors, thin film force sensors and quantum tunnelling composite-based force sensors. In some arrangements, other types of sensor may be employed.

In some arrangements, the electrical or electronic signal generated by a force sensor 130 may be a function of a magnitude of the force, pressure, or touch applied to the force sensor. Such electronic or electrical signal may comprise a general purpose input/output signal (GPIO) associated with an input signal in response to which the controller 110 controls some functionality of the device 100. The term "force" as used herein may refer not only to force, but to physical quantities indicative of force or analogous to force such as, but not limited to, pressure and touch.

The I/O unit 140 may be housed within enclosure 101, may be distributed across the device 100 (i.e. it may represent a plurality of units) and may be communicatively coupled to the controller 110. Although not specifically shown in FIG. 1, the I/O unit 140 may comprise any or all of a microphone, an LRA (or other device capable of outputting a force, such as a vibration), a radio (or other electromagnetic) transmitter/receiver, a speaker, a display screen (optionally a touchscreen), an indicator (such as an LED), a sensor (e.g. accelerometer, temperature sensor, tilt sensor, electronic compass, etc.) and one or more buttons or keys.

As a convenient example, the device 100 may be a haptic-enabled device. As is well known, haptic technology recreates the sense of touch by applying forces, vibrations, or motions to a user. The device 100 for example may be considered a haptic-enabled device (a device enabled with haptic technology) where its force sensors 130 (input transducers) measure forces exerted by the user on a user interface (such as a button or touchscreen on a mobile telephone or tablet computer), and an LRA or other output transducer of the I/O unit 140 applies forces directly or indirectly (e.g. via a touchscreen) to the user, e.g. to give haptic feedback. Some aspects of the present disclosure, for example the controller 110 and/or the force sensors 130, may be arranged as part of a haptic circuit, for instance a haptic circuit which may be provided in the device 100. A circuit or circuitry embodying aspects of the present disclosure (such as the controller 110) may be implemented (at least in part) as an integrated circuit (IC), for example on an IC chip. One or more input or output transducers (such as the force sensors 130 or an LRA) may be connected to the integrated circuit in use.

Of course, this application to haptic technology is just one example application of the device 100 comprising the plurality of force sensors 130. The force sensors 130 may simply serve as generic input transducers to provide input (sensor) signals to control other aspects of the device 100, such as a GUI (graphical user interface) displayed on a touchscreen of the I/O unit 140 or an operational state of the device 100 (such as waking components from a low-power "sleep" state).

The device 100 is shown comprising four force sensors 130, labelled s1, s2, s3 and s4, with their signals labelled S1, S2, S3 and S4, respectively. However, for some of the functionality disclosed herein the device 100 need only comprise one or a pair of (i.e. at least two) force sensors 130. Example pairs comprise s1 and s2 (on different or opposite sides of the device 100) and s1 and s3 (on the same side of the device 100). Of course, the device 100 may comprise more than four force sensors 130, such as additional sensors s5 to s8 arranged in a similar way to sensors s1 to s4 but in another area of the device 100. As another example, the device 100 may comprise three or more force sensors 130 arranged on the same side of the device (like s1 and s3), for example in a linear array so that some of those force sensors 130 are adjacent to one another and some are separated apart from one another by at least another force sensor 130.

Although FIG. 1 is schematic, the sensors s1 to s4 are located so that they can receive force inputs from a user, in particular a user hand, during use of the device 100. A user force input in this context corresponds to a user touching, pushing, pressing, or swiping the device, optionally with one or both of their hands, in the vicinity of one or more of the force sensors 130. In some cases a force (e.g. a threshold amount of force) may be applied at multiple force sensors at or substantially at the same time (simultaneously or contemporaneously). Of course, in other cases the user may apply a user force input at a single force sensor 130. A change in the amount of force applied may be detected, rather than an absolute amount of force detected, for example.

Thus, the force sensors s1 to s4 may be located on the device according to anthropometric measurements of a human hand. For example, where there is only a pair of force sensors 130, they may be provided on the same side (e.g. s1 and s3) or on opposite/different sides (e.g. s1 and s2) of the device 100 as mentioned above. The force sensors 130 are provided at different locations on the device, but may be in close proximity to one another.

In one arrangement (not shown in FIG. 1), the force sensors s1 to s4 may be provided in a linear array or strip on one side of the device 100 (another linear array of force sensors s5 to s8 may be provided on the opposite side of the device 100), and potentially in close proximity to one another.

A given user force input (from a touch of the device 100 in the area of the force sensors 130) may result in forces being picked up at a plurality of force sensors 130, in part due to mechanical interaction (e.g. mechanical connections, such as via the enclosure 101) between the force sensors 130.

To generalise the arrangement of FIG. 1, the device 100 may be considered to comprise N force sensors 130, where in some arrangements N=1 and in other arrangements N>1. Taking N>1 (i.e. at least two force sensors 130) as an example, the force sensors 130 may be referred to as force sensors s1 to sN (or simply sensors 1 to N). The controller 110 is thus operable in the generalised arrangement, based on input sensor signals S1 to SN which originate (stem or are derived or received) from the respective sensors 1 to N, to implement a force sensing system.

Figure 2:
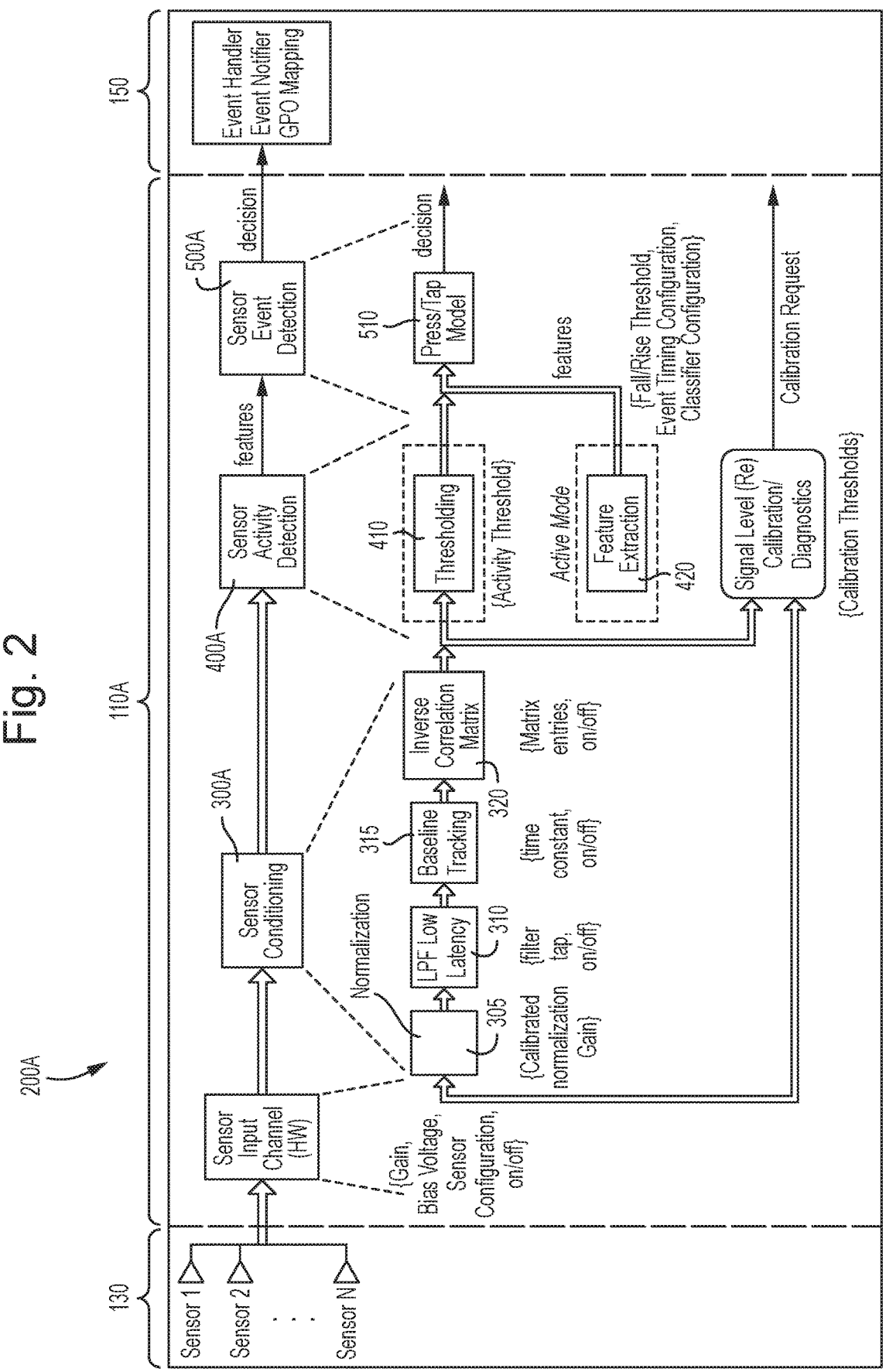
FIG. 2 is a schematic diagram of an example force sensing system, relating to the device of FIG. 1.
Figure 3:
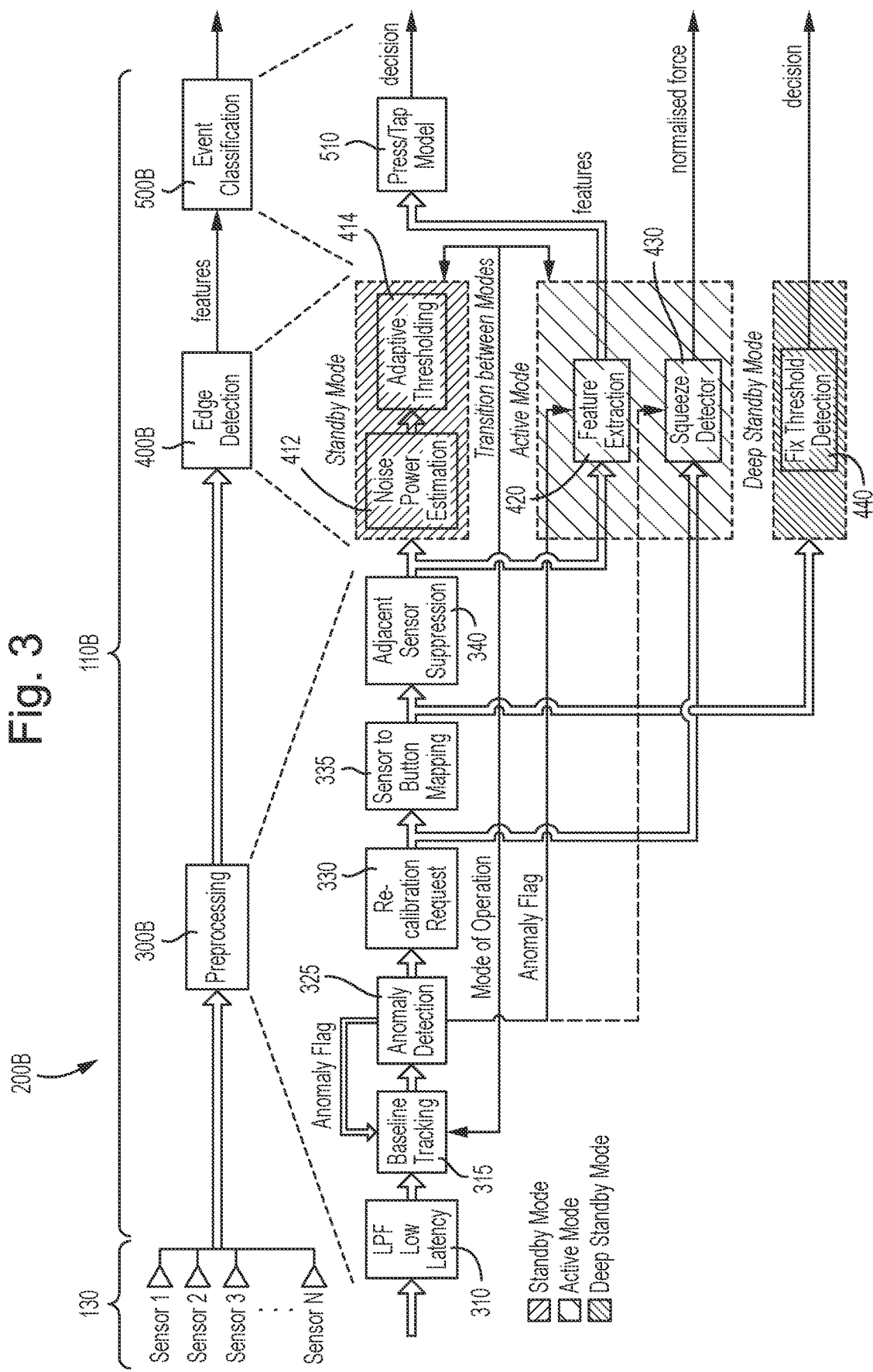
FIG. 3 is a schematic diagram of another example force sensing system, relating to the device of FIG. 1.

Example such force sensing systems will be better understood in connection with FIGS. 2 and 3.

Force Sensing System

FIG. 2 is a schematic diagram of an example force sensing system 200A, relating to the device 100. The system 200A is depicted as comprising sensors 130 (sensors 1 to N), a controller 110A (as an example detailed implementation of the controller 110) and further control circuitry 150 (not shown in FIG. 1). However, the system 200A may be taken as the controller 110A alone, with the sensors 130 and the further control circuitry 150 being external to the system 200A.

The input sensor signals derived from the sensors 1 to N are received by the controller 110A at a sensor input channel of the controller as indicated, e.g. at a physical hardware input of the controller 110A. The functionality of the controller 110A is organised into three general stages in particular a sensor conditioning stage 300A, a sensor activity detection stage 400A and a sensor event detection stage 500A.

The division into stages may be considered a division into sections, units or modules, and may be considered schematic. The functionality of the controller 110A may be implemented in software, executed on a processor of the controller 110A, or in hardware, or in a combination of software and hardware.

The sensor conditioning stage 300A itself comprises stages corresponding to respective sensor (or signal) conditioning activities or processes. As in FIG. 2, these activities comprise normalisation 305, filtering (e.g. low-pass filtering, such as low-latency low-pass filtering) 310, baseline tracking 315, and the application of an inverse correlation matrix (for example, to reduce the effect or impact of mechanical crosstalk between the sensors 130).

The sensor activity detection stage 400A itself comprises stages corresponding to respective detection activities or processes. As in FIG. 2, these comprise a thresholding stage 410 (for example, to determine signal-level thresholds in an adaptive manner) and a feature extraction stage 420 (for example, to extract particular defined features from the sensor signals for use by the sensor event detection stage 500A). The sensor activity detection stage 400A may be configured to act on the sensor signals as conditioned by the sensor conditioning stage 300A (as suggested in FIG. 2) and/or on the sensor signals as received from the sensors 130.

The sensor event detection stage 500A comprises a press/tap model stage 510, configured to classify the user force input based on the features extracted by the feature extraction stage 420. The press/tap model stage 510 may in some arrangements be configured to act on the sensor signals as conditioned by the sensor conditioning stage 300A and/or on the sensor signals as received from the sensors 130, along with signal-level thresholds from the thresholding stage 410.

Further Force Sensing System

FIG. 3 is a schematic diagram of another example force sensing system 200B, which may be considered a variation of the force sensing system 200A and is useful for understanding in more detail how various stages function. The system 200B will form the basis of a running example.

The system 200B is depicted as comprising sensors 130 (sensors 1 to N), a controller 1108 (as an example detailed implementation of the controller 110). As before, the system 200B may be taken as the controller 1108 alone.

In line with the system 200A, the functionality of the controller 1108 is organised into three general stages, in particular a preprocessing stage 300B, an edge detection stage 400B and an event classification stage 500B.

Stages 300B, 400B and 500B may be compared to stages 300A, 400A and 500A, respectively. To ease understanding, like elements have been denoted with like reference signs where possible. As before, the division into stages may be considered a division into sections, units or modules, and may be considered schematic. The functionality of the controller 1108 may be implemented in software, executed on a processor of the controller 1108, or in hardware, or in a combination of software and hardware.

In the preprocessing stage 300B as compared to the sensor conditioning stage 300A, the inverse correlation matrix stage 320 has been replaced with an anomaly detection stage 325, a re-calibration request stage 330, a sensor to button mapping stage 335 and an adjacent sensor suppression stage 340. The adjacent sensor suppression stage 340 may be compared with the inverse correlation matrix stage 320.

The anomaly detection stage 325 is configured to detect user force inputs which do not satisfy, or which deviate from, a model defining one or more "normal" or "expected" user force inputs. Put another way, the anomaly detection stage 325 may be configured to detect user force inputs which satisfy a model defining one or more "abnormal" user force inputs. In this way, the anomaly detection stage 325 may detect an abnormal use (or misuse) of the device 100 and use this detection to raise an anomaly flag (e.g. set the value of an anomaly-flag variable to 1 from 0). The anomaly flag may be used to disable or affect the operation of other stages of the controller 1108 (for example to save power or processing overhead) as indicated. Example functionality of the anomaly detection stage 325 is considered in more detail later herein.

The re-calibration request stage 330 is configured to detect properties of the sensor signals (as conditioned by the preceding stages) which indicate that a re-calibration process is needed. The re-calibration request stage 330 may be configured to initiate or trigger the re-calibration process when it is detected that the sensor signals (as conditioned by the preceding stages) no longer meet a defined specification.

The sensor to button mapping stage 335 is configured to combine (e.g. by weighted sum or average) sensor signals which originate from different sensors 130 (with appropriate weighting) so that each combined sensor signal corresponds to a virtual button whose location is defined relative to locations of the sensors 130. Sensor signals prior to the sensor to button mapping stage 335 may be considered sensor signals in the sensor domain (i.e. the signals are per sensor) and sensor signals output by the sensor to button mapping stage 335 may be considered sensor signals in the button domain (i.e. the signals are per "virtual" button).

The adjacent sensor suppression stage 340 is configured to subtract a proportion of one sensor signal from another to reduce or suppress the effect of mechanical crosstalk between the sensors 130 on the sensors signals. The adjacent sensor suppression stage 340 is shown operating in the button domain, i.e. on combined sensor signals, but it could operate in the sensor domain.

Although not shown in FIG. 3, a sensitivity correction stage may be provided in the preprocessing stage 300B, for example in the signal path between the baseline tracking stage 315 and the anomaly detection stage 325. The sensitivity correction stage may for example adjust the sensor signals to compensate for changes in sensor sensitivity with temperature (e.g. it compensates the sensitivity of the sensor(s) according to a given temperature).

In the edge detection stage 400B as compared to the sensor activity detection stage 400A, the thresholding stage 410 has been replaced by a noise power estimation stage 412 and an adaptive thresholding stage 414. In the running example, these stages are configured to determine signal-level thresholds in an adaptive manner, in particular a noise threshold below which signal energy is dominated by noise energy. Example functionality of the noise power estimation stage 412 and the adaptive thresholding stage 414 is considered in more detail later herein. The noise power estimation stage 412 and adaptive thresholding stage 414 are shown operating in the button domain, i.e. on combined sensor signals, but could operate in the sensor domain.

The feature extraction stage 420 in FIG. 3 is shown operating based on sensor signals output by the adjacent sensor suppression stage 340, in the button domain. This is of course one example; the feature extraction stage 420 could operate on any of the sensor signals employed in the system 200B depending on the application. The output of the feature extraction stage 420 in the running example is a feature stream made up of indications of features detected in the sensor signal concerned. In an example implementation described later these indications are provided in the form of feature vectors.

Also provided in the system 200B is a squeeze detector stage 430. The squeeze detector stage 430 is configured to detect a user squeeze input as an example user force input in which the user has applied a compressive force to the device 100. The squeeze detector stage 430 is shown operating in the sensor domain but it could operate in the button domain, i.e. on combined sensor signals. Such a user squeeze input may be picked up by corresponding sensors 130 (or corresponding virtual buttons), for example located on different or opposing sides or edges of the device 100, and as such the squeeze detector stage 430 may be configured to operate on particular pairs or groups of sensors signals accordingly.

Also provided in the system 200B (e.g. in the edge detection stage 400B) is a fix (or fixed) threshold detection stage 440, which may be optional. The fix threshold detection stage 440 is shown operating in the button domain, i.e. on combined sensor signals, but it could operate in the sensor domain. The fix threshold detection stage 440 is configured to determine whether one or more sensor signals (e.g. combined sensors signals) exceed a fixed threshold value, for example to indicate that a base level of activity has been detected. Such a level of activity may for example be sufficient to cause the controller 110B to transition between modes of operation.

In this respect, the fix threshold detection stage 440 (e.g. in the edge detection stage 400B) is indicated in FIG. 3 as operating in a "deep standby mode", the noise power estimation stage 412 and adaptive thresholding stage 414 are indicated as operating in a "standby mode", and the feature extraction stage 420 and the squeeze detector stage 430 are indicated as operating in an "active mode". For reasons of power or processing overhead efficiency, the controller 110B may be configured to transition between the modes of operation with certain stages being disabled or placed in a low-power sleep state in certain modes of operation.

For example, the noise power estimation stage 412 and adaptive thresholding stage 414 may be disabled unless the controller 110B is in the standby or active mode. The transition from the deep standby mode to the standby mode may occur when one or more sensor signals (or combined sensors signals) exceed the fixed threshold value mentioned above. As another example, the feature extraction stage 420 and the squeeze detector stage 430 may be disabled unless the controller 110B is in the active mode. The transition from the standby mode to the active mode may occur when one or more sensor signals (or combined sensors signals) exceed a threshold value such as a noise threshold determined by the noise power estimation and adaptive thresholding stages 412, 414.

As another example, the sample frequency, data acquisition rate, scan rate or sample rate at which the sensors 130 are sampled (and at which the consequential sensor signals are processed) may be dependent on the mode of operation. For example, one (very low) sample rate may be used in the deep standby mode, another (low) sample rate may be used in the standby mode, and a further (high) sample rate may be used in the active mode. In the running example, a low sample rate of e.g. 30 Hz is used in the standby mode and a high sample rate of e.g. 1000 Hz is used in the active mode.

The event classification stage 500B comprises a press/tap model stage (module) 510 corresponding to that in the sensor event detection stage 500A, operating in the button domain and based on the feature stream output by the feature extraction stage 420. The press/tap model stage 510 may in some arrangements (although not indicated in FIG. 3) be configured to act on the sensor signals as conditioned by the preprocessing stage 300B and/or on the sensor signals as received from the sensors 130, in either the button or sensor domain.

Although not shown in FIG. 3, there may be provided a post-processing stage, as a fourth stage following the event classification stage 500B. The post-processing stage may comprise a confidence adjustment stage and an event time constraint stage, for example provided in that order so that the confidence adjustment stage operates based on an output signal of the press/tap model stage 510 and so that the event time constraint stage operates based on an output signal of the confidence adjustment stage. The confidence adjustment stage and event time constraint stage may be configured to reject events that do not fulfil given (e.g. different, for different events) pre-defined constraints. The confidence adjustment stage may for example receive a virtual button confidence measure from the sensor to button mapping stage 335.

Thresholds

Figure 4A:
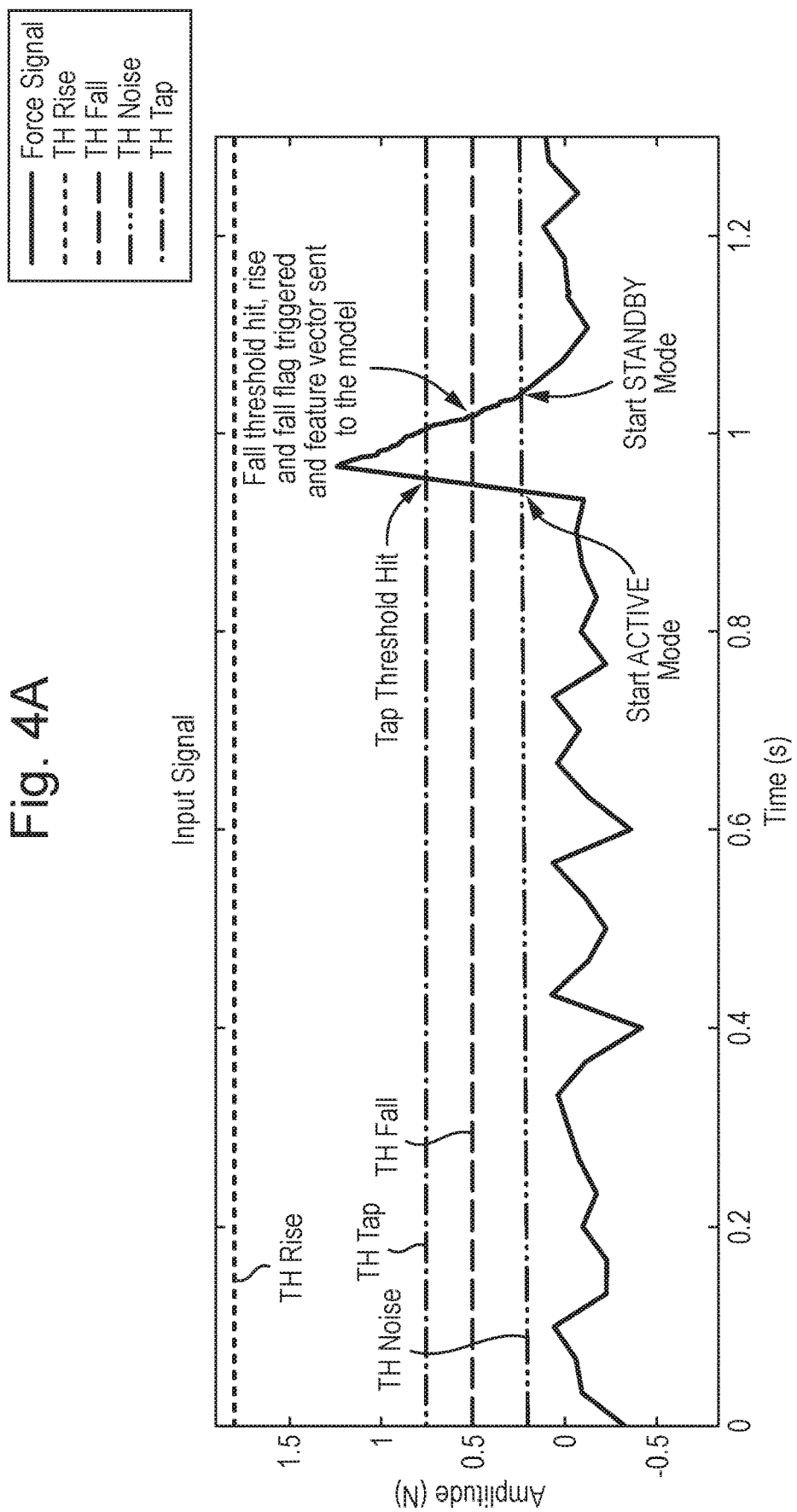
FIGS. 4A and 4B are graphs showing how example thresholds are employed by the system of FIG. 3.
Figure 4B:
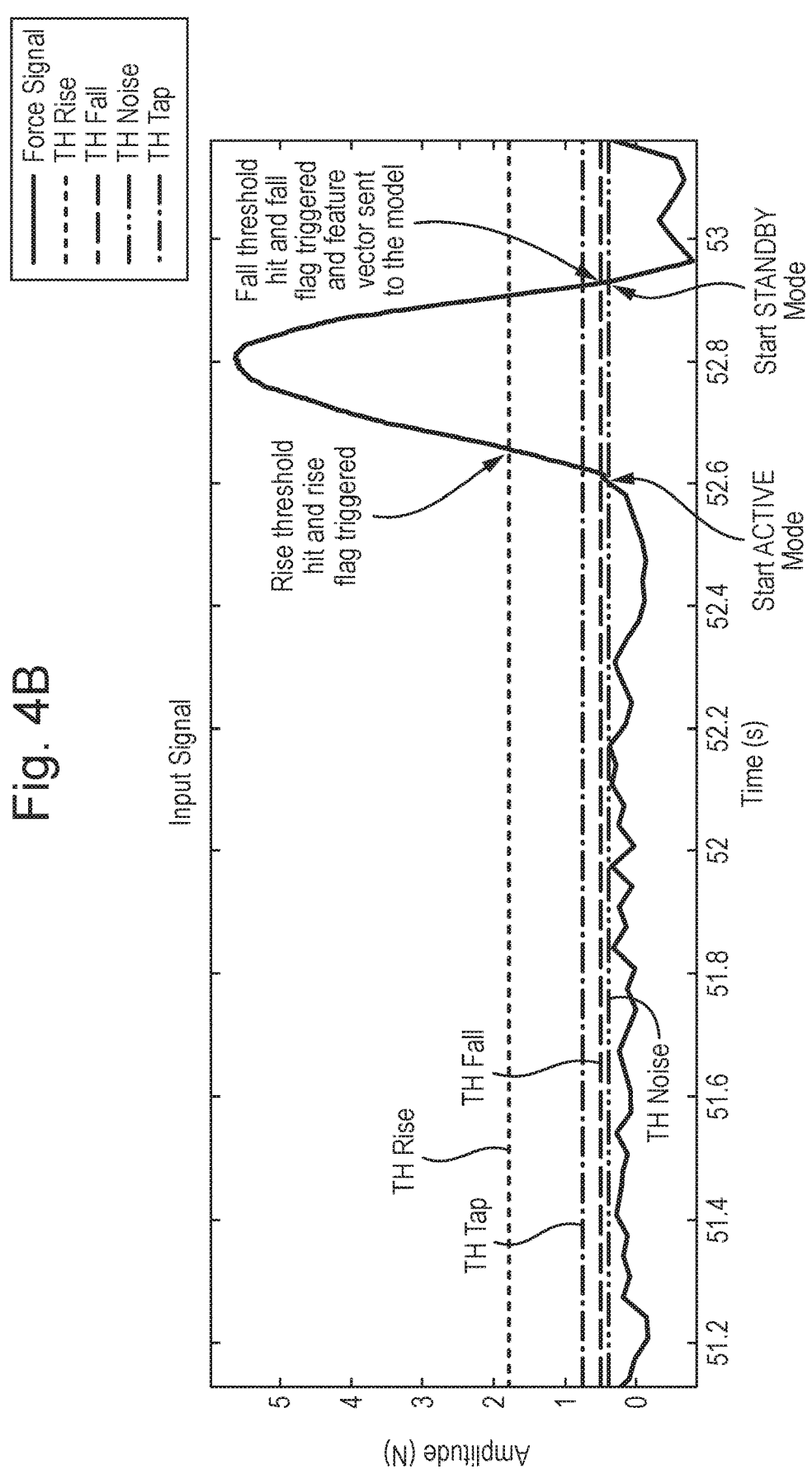

To aid in an understanding of the functionality of various units of the controller 110B, FIGS. 4A and 4B are graphs showing how example thresholds are employed by the system 200B in the running example, in particular by the controller 110B, in the context of detecting a user tap (a tap event) and a user press (a press event), respectively.

In each of FIGS. 4A and 4B, an example sensor signal (or combined sensor signal) is shown plotted with signal amplitude in Newtons (y-axis) against time in seconds (x-axis). This may be taken as representative of an input signal from any type of force sensor. For example, in the case of resistive sensors a voltage across the sensor may translate to such a signal amplitude, whereas in the case of inductive sensors (or resistive-inductive-capacitive sensors) which are driven with an AC signal, a measured phase may translate to such a signal amplitude. The discussion of amplitudes herein will thus be considered to include e.g. amplitudes of a phase signal (i.e. changes of the phase signal).

In both cases, four thresholds are shown, namely a noise threshold (TH noise), a fall threshold (TH fall), a tap threshold (TH tap) and a rise threshold (TH rise), having successively larger amplitude values in that order.

In FIG. 4A a tap event is shown. This event is quite short (approximately 100 ms in the example) and is characterised by low force. This is one motivation for using a low tap threshold TH tap to detect taps. In FIG. 4B, a normal push event is shown. In that case, the event is longer (approximately 330 ms in the example) and higher in force than the tap. Thus, a higher threshold such as TH rise can be used.

Looking at FIGS. 4A and 4B, the controller 110B is configured in the running example to employ these example thresholds as follows.

The TH noise threshold is (in the running example) computed dynamically or adaptively as explained later. Also, if the current signal amplitude (force reading) is above the TH noise threshold, the system is configured to operate using the high sample rate mentioned earlier (active mode), however if the current amplitude (force reading) is below the TH noise threshold the system is configured to operate using the low sample rate mentioned earlier (standby mode). Therefore, the TH noise threshold may control the sample rate used for each new incoming signal sequence (or signal sample) and hence power consumption.

If the sensor signal hits the TH rise threshold (see FIG. 4A), the system triggers a rise flag. However, FIGS. 4A and 4B demonstrate that this threshold will not be hit in all cases, such as when a tap event occurs.

When the sensor signal rises above the tap threshold TH tap, the system (in particular, the feature extraction stage 420) starts to populate a feature vector. In the running example, this vector contains the length of the pulse, gradient to the maximum peak, time from the point it crosses the tap threshold TH tap to the maximum peak and also the maximum value of the peak. Effectively, the feature vector contains features which define the profile or shape of the waveform between rising through the tap threshold TH tap and then falling through the TH fall threshold.

If the sensor signal hits the TH fall threshold (once it was already above the TH tap or TH rise threshold) the system sends the features of the current signal sequence (the feature vector) as obtained by the feature extraction stage 420 to the press/tap model stage 510 and triggers a fall flag. In a case where the signal only reached the tap threshold TH tap but not the rise threshold TH rise (as shown in FIG. 4A), then also the rise flag is triggered at this point. The situation in which the rise and fall flags are triggered is thus a reflection of the current signal sequence.

This feature vector is updated for each sample (i.e. at the sample rate) until it is finally sent to the model when the signal is below the fall threshold TH fall. This avoids continually sending information to the model, i.e. the press/tap model stage 510. After the feature vector is sent to the press/tap model stage 510 for a given signal sequence, it is removed or cleared from the feature extraction stage 420 so that it can be repopulated for a subsequent signal sequence.

Anomaly Detection

It will later be explained how the press/tap model stage 510 uses the features, in particular the feature vector, to determine whether a tap event or a press event (or some other defined event, i.e. a "wanted" event) has occurred. However, before the detection of such events (desired or recognised "normal" user inputs) is explained, the detection of anomalies (undesired user inputs) will be considered.

The sensors 130, placed on any location of the device 100, are intended to measure displacements of the enclosure 101 which are then mapped to a force given the sensitivity of the sensor 130. These sensors 130 can be used for example to measure the force in a particular location of the device 100 and trigger a 'button pressed' internal state or event when the force is above a certain level. However, there are other actions, such as twisting or bending the device 100, that can cause a displacement of the enclosure 101 and therefore create a force on the sensor 130 that is similar (in terms of force magnitude and/or duration) to a button press. This kind of action might potentially falsely trigger internal events or states and thus reduce the overall performance of the force sense system 200B.

The anomaly detection stage 325 is intended to avoid such false triggers caused by a misuse (non-intended use) of the device 100. Any unexpected behaviour of a candidate (input) sensor signal, i.e. the signal to be processed, is flagged in time.

In force sense domain, the signals acquired, when an intended or "normal" event is present, can be well characterised as a signal rising from approximately 0 amplitude and then falling after a limited period of time to approximately again the same initial value (see FIGS. 4A and 4B). The anomaly detection stage 325 is configured to identify patterns (or particular or given characteristics) that do not follow such normal characteristics. In overview, when a signal follows a pattern that is different from an expected or normal pattern, an anomaly flag is triggered.

The anomaly flag may be used to disable making any decision (e.g. on a type of user force input occurring, such as a push or tap event) at that point. For example, the anomaly flag may be used to disable the feature extraction stage 420 and/or the squeeze detector stage 430. The anomaly flag may also be used to disable bias tracking (e.g. by baseline tracking stage 315) in order to avoid using any of this data to update the force sense system.

Figure 5:
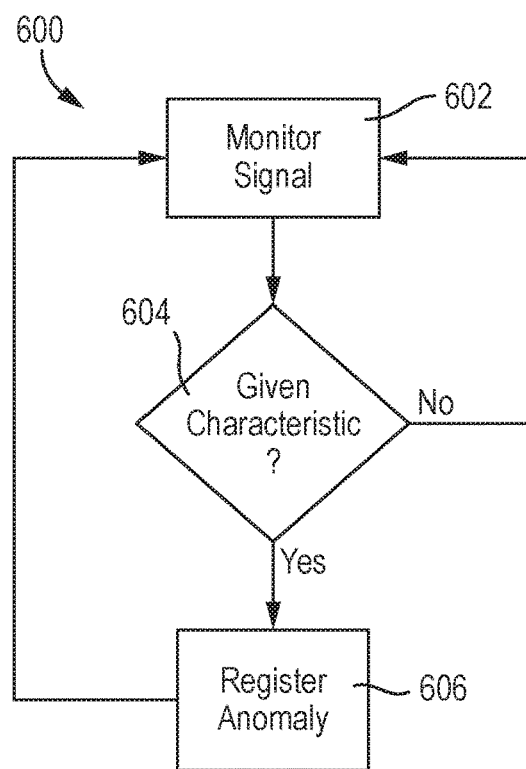
FIG. 5 is a flowchart presenting an example method of anomaly detection.

FIG. 5 is a flowchart presenting an example method 600 of anomaly detection, comprising steps 602, 604 and 606, carried out by the anomaly detection stage 325.

In step 602, a candidate sensor signal is monitored. This signal may be a sensor signal derived from an individual sensor 130, or for example a combination (such as an average) of sensor signals derived from individual sensors 130, i.e. in the sensor domain. In another arrangement the candidate sensor signal may be a combination sensor signal representing a virtual button as output by the sensor to button mapping stage 335, or an average of such combination sensor signals, i.e. in the button domain.

In step 604 it is determined whether the candidate sensor signal has a given characteristic which identifies that signal as representing an anomalous user force input (an anomaly). If it does not (NO, step 604), the method 600 returns to step 602 to continue monitoring the candidate sensor signal. If it does (YES, step 604), the method proceeds to step 606 where an anomaly is registered (corresponding to the anomaly flag being raised). The method 600 then returns to step 602. The method 600 may be terminated at any point.

Multiple approaches can be used in step 604 to detect a deviation of the candidate sensor signal from the expected pattern, i.e. to detect the or at least one given characteristic. One approach is to calculate the sum of the amplitude signals coming from some or all of the sensors 130 and activate the anomaly flag if this summation is less than a predetermined negative value. This approach is explored further below. Alternatively, the candidate sensor signal can be modelled by its statistics and the anomaly flag triggered when the statistics of the incoming signal deviate from the model. Different features could potentially be used to measure this pattern inconsistency. Another possibility is to use a classification algorithm and this possibility is mentioned later in connection with event detection.

As above, one possible implementation of step 604 is to detect negative forces on the N channels. In an example, the parameter used to quantify this behaviour is the average $\bar{x}(n)$ of the amplitude on the N channels:

$$\bar{x}(n) = \frac{1}{N}\sum_{i=1}^{N} x_i(n)$$

where the sensor signals are digital signals comprising a series of numbered samples, n is the sample number, i is the channel number, N is the total number of channels (which may have a 1-to-1 relationship with the force sensors 130 in the sensor domain, or a 1-to-many mapping in the case of virtual buttons), and $x_i(n)$ represents the sensor signal for channel i.

The parameter $\bar{x}(n)$ is then mapped to a 0 to 1 value using the following sigmoid function:

$$\gamma(n) = \frac{1}{1 + \exp(a \cdot \bar{x}(n) - b)}$$

Figure 6:
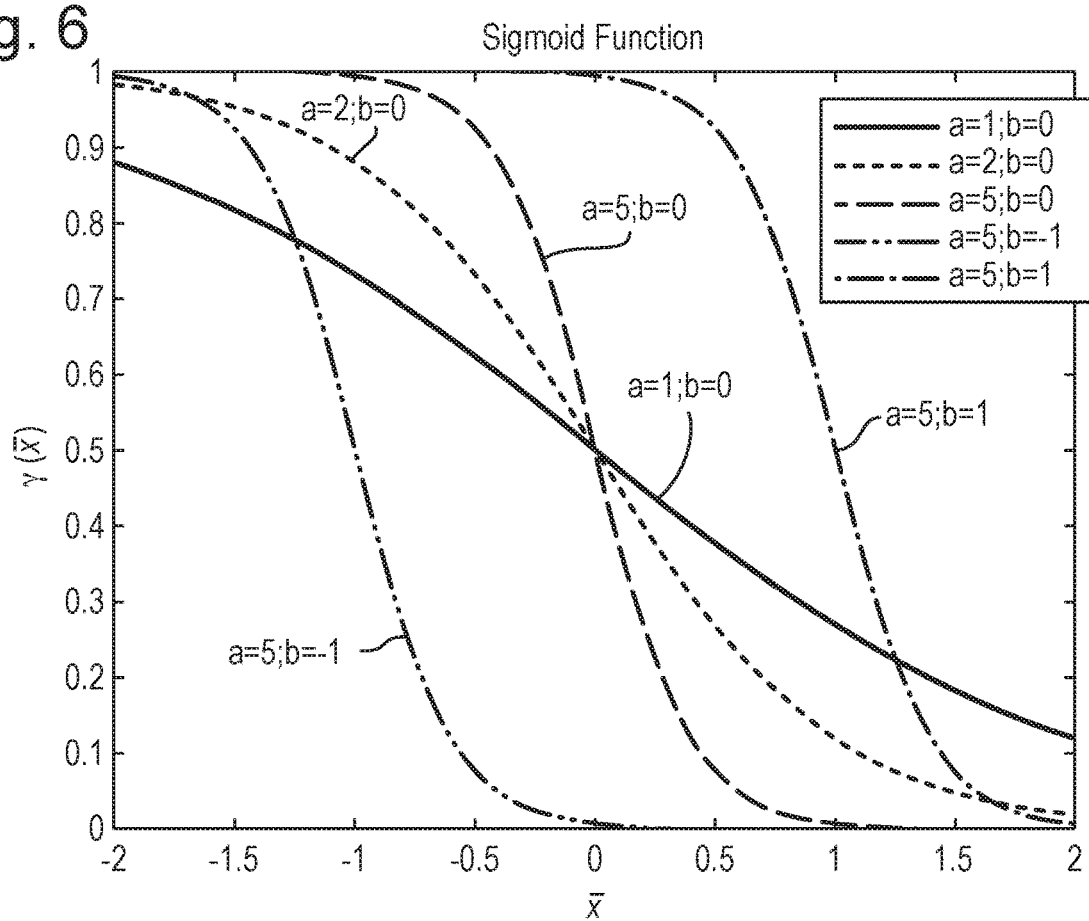
FIG. 6 is a graph which shows how a sigmoid function can be used to map parameter values to a 0 to 1 value.

FIG. 6 is a graph which shows how the parameter $\bar{x}(n)$ may be mapped to a 0 to 1 value, using four different combinations of values for a and b. Generally speaking, the value a controls the slope and the value b controls the x-axis value ($\bar{x}(n)$) at which the output transitions from 0 to 1. Of course, the transitioning from 0 to 1 (or vice versa) is one example convenient for digital signal processing. Sigmoid functions or other mapping functions may be used to map values into other ranges (e.g. −1 to +1).

Figure 7:
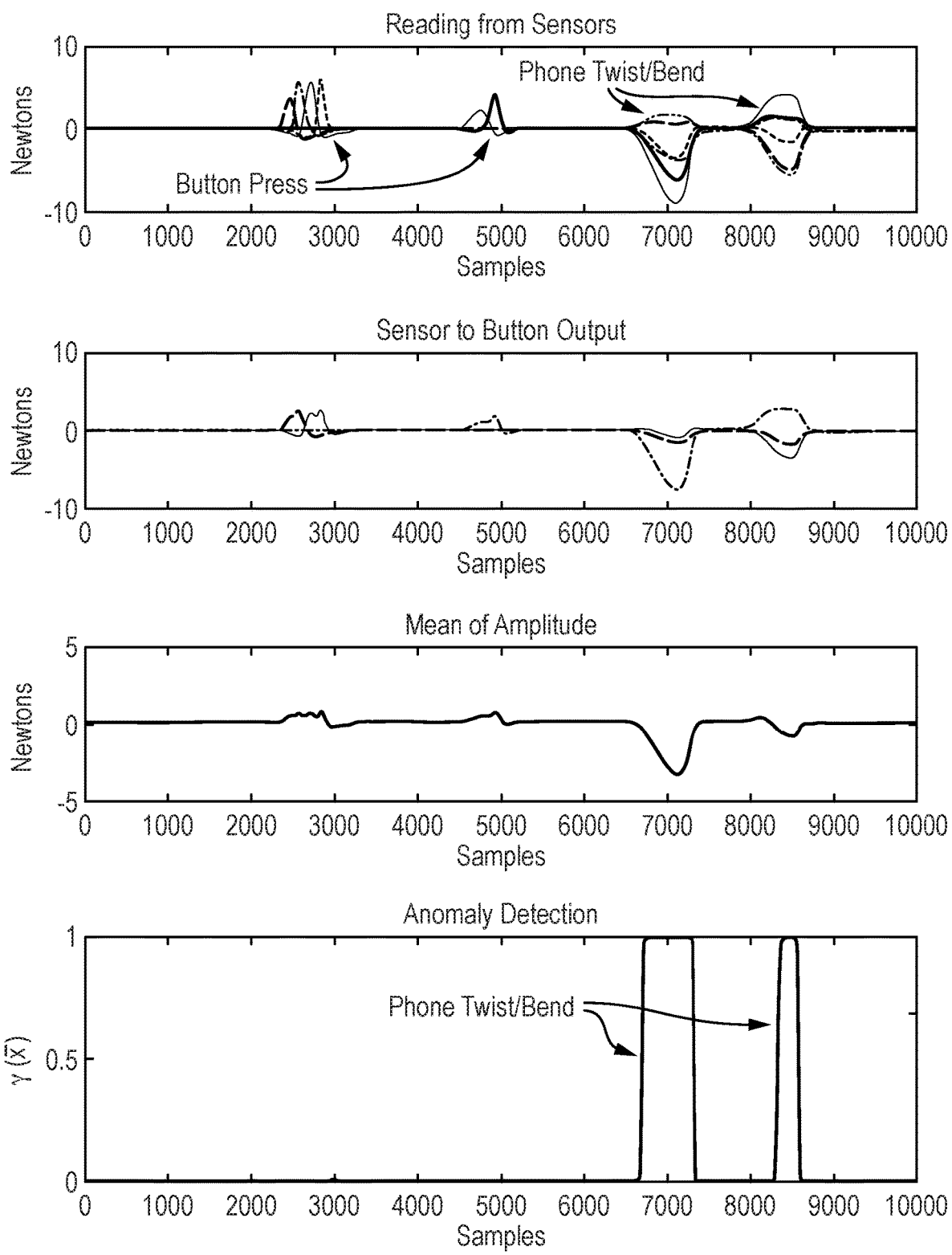
FIG. 7 shows a series of graphs of results where anomaly detection was tested on a device having six sensors or channels.

FIG. 7 shows a series of graphs of results where the above approach was tested on a device 100 having six sensors (channels) 130. In particular, the configuration employed comprised four sensors 130 on one side of the device 100 (e.g. s1, s3 and two others) and two sensors 130 (e.g. s2 and s4) on the other side.

In the test, first the six sensors 130 (buttons) were pressed sequentially and then two types of twist were made to the device 100. In the upper-most graph the individual sensor signals for the six sensors 130 are shown, and the tested sequence of button pressing and twisting can be seen. In the upper-central graph combined sensor signals (corresponding to virtual buttons) are shown using a 2-to-1 mapping of sensors 130 to virtual buttons, to help give a clearer indication of the forces applied to the device 100. In the lower-central graph the average (mean) of the combined sensor signals from the upper-central graph (effectively equivalent to an average of the sensor signals from the upper-most graph) is shown, i.e. $\bar{x}(n)$, and in the lower-most graph the result of applying the above sigmoid function (with particular values of a and b) to the average is shown.

FIG. 7 demonstrates that this implementation of the method 600 (in particular, step 604) correctly detects the example "unwanted" twists of the device 100, i.e. anomalies, in that at these moments the signal in the lower-most graph goes from 0 to 1 (and is otherwise at 0).

Another possibility, in addition to or instead of looking for a negative average (mean) value, would be to look for a negative cross-correlation between specific pairs of sensor signals (where such a negative cross-correlation would be expected to be indicative of an anomaly). In such a case the lower-central graph could plot the cross-correlation for specific pairs of sensor signals and a mapping function such as a sigmoid function could be used to translate each plot to an anomaly detection signal comparable to that in the lower-most graph.

As before, when an anomaly is detected the system 200B (e.g. the anomaly detection stage 325 itself) may be configured to disable one or more functions of the system (or indeed of the host device 100), in practice via raising an anomaly flag. For example, as in FIG. 3, this could involve (selectively) disabling the baseline tracking stage 315 and/or the feature extraction stage 420 (e.g. along with the press-tap model stage 510).

Thus, in general, the system is configured to recognise anomalous (unwanted) user inputs and to control operation of the system in response. This control may comprise changing a mode of operation, changing a sample rate, or disabling (or transitioning to a low-power mode) one or more functions/units, e.g. selectively. This may enable improved power or processing overhead efficiency, or reduce the number of false positives (falsely recognised user inputs).

Event Detection

The press/tap model stage 510 will now be considered further, in particular its use of signal features (e.g. feature vectors) to determine whether a tap event or a press event (or some other defined event, associated with a corresponding "wanted", "accepted", "supported" or "intended" user force input) has occurred. Basic supported events such as tap and press events which correspond to such supported user force inputs may be referred to as core events.

In overview, the event detection functionality of the press/tap model stage 510 reduces the complexity of detection of core events from force sensor readings (i.e. sensor signals, or combined sensors signals). These core events may be tap, push/press, and long push/press events in the context of a device 100 such as a mobile telephone or tablet computer, although these are simply examples. The event detection functionality is configured to recognise not only defined core events but also combinations of them which may be referred to as gestures. Example gestures include sliding up/down, double tap and double press events.

The detection of core events from one or more sensor signals may involve considering multiple signal features (signal characteristics) such as duration, maximum force applied or the gradient of a rising pulse. This dependency could lead to the need for a complex and large state-machine implementation simply to distinguish between a few different core events.

To avoid such complexity the event detection functionality employs a classification algorithm which operates based on the input sensor signals (or, in the case of FIG. 3, on a feature vector) to categorise a user input. Many possible algorithms exist, for example including neural networks and indeed any machine learning model.

A model may be generated from recorded training data and implemented by way of a corresponding (classification) algorithm to classify a given signal sequence (extracted from a sensor signal), with the added advantage that real data guides the discrimination problem. Such model-based core event detection may enable ready adaptation of the algorithm to new data, e.g. for a new setup of the sensors 130 on the device 100, whilst maintaining good performance on the given training data.

FIG. 8 is a flowchart presenting an example method 800 of event detection, comprising steps 802, 804, 806, 808 and 810, carried out by the feature extraction stage 420 in combination with the press/tap model stage 510.

In step 802, a signal sequence is extracted from a candidate sensor signal as a sequence which may (or may not) represent a core event. This signal may be a sensor signal derived from an individual sensor 130, or for example a combination of sensor signals derived from individual sensors 130. In another arrangement the candidate sensor signal may be a combination sensor signal representing a virtual button, i.e. in the button domain, as output by the sensor to button mapping stage 335.

Looking back to FIGS. 4A and 4B, the signal sequence may be extracted based on one or more thresholds, for example the noise threshold TH noise, fall threshold TH fall, tap threshold TH tap or rise threshold TH rise already described. Continuing the running example, the signal sequence may be considered to start when the sensor signal rises above the tap threshold TH tap and finish when the signal falls below the fall threshold TH fall.

In step 804, defined signal features are extracted from the signal sequence. In the present example, when the sensor signal rises above the tap threshold TH tap the system (in particular, the feature extraction stage 420) starts to populate the feature vector. This vector contains the length of the pulse, gradient to the maximum peak, time from the point it crosses the tap threshold TH tap to the maximum peak and also the maximum value of the peak. This feature vector is updated for each sequence, sample-by-sample (i.e. at the given sample rate) until the samples which make up the sequence have been processed.

The feature vector once complete for the signal sequence concerned is sent to the press/tap model stage 510, after which the feature vector is removed or cleared from the feature extraction stage 420 so that it can be repopulated for a subsequent signal sequence.

In step 806, the signal sequence concerned is classified on the basis of its feature vector. This involves applying the feature vector to the model generated from recorded training data, to determine if the signal sequence can be classified as corresponding to any of the defined core events supported by the model. This may lead to a sequence classification corresponding to the signal sequence concerned, the classification indicating to which if any of the core events (categories) defined by the model it has been determined that the signal sequence belongs. In some cases thus the classification may indicate that the sequence concerned does not belong to (or represent) any of the core events.

In step 808 it is determined whether multiple signal sequences have been classified, so that it can be determined whether combinations of classifications (core events) can be recognised as corresponding to defined gestures as mentioned above. If so (YES, step 808), the method proceeds to step 810 where such combinations of classifications are classified as corresponding to gesture events. Otherwise (NO, step 808), the method returns to step 802. The method 800 may be terminated at any time.

Multiple approaches can be used in step 806 to classify the signal sequence on the basis of its feature vector, as indicated earlier. One approach is based on support vector machines (SVM) due to their generalization capabilities given a small dataset (and thus advantageous when implemented in "small" devices 100 such as mobile telephones). As above, the set of features extracted from the signal sequence (force sensing data when the signal is above one or more thresholds) for use by an SVM classifier may be (in the context of a push input): number of samples; area underneath the push waveform; gradient estimation and maximum value of the push.

The use of an SVM classifier or model by the press/tap model stage 510 will now be considered, using the running example where the feature extraction stage 420 extracts features based on a signal sequence which starts when it exceeds the tap threshold TH tap and ends when the signal falls below the fall threshold TH fall. As above, in the running example the sensors 130 are sampled at a low sample rate (e.g. 30 Hz) when the signal is below the noise threshold TH noise and at a high sample rate (e.g. 1000 Hz) when the signal is above the noise threshold TH noise.

As before, an SVM classifier is useful when there will not be a large amount of data for any one device 100; it can generalise patterns from few examples (training signal sequences or training feature vectors).

The classifier inputs a feature vector created by the feature extraction stage 420. Assuming a linear SVM kernel for the sake of example (a non-linear kernel would also be possible):

$$d_i(n) = \beta_i x(n) + b_i$$

where $d_i(n)$ is the distance of the normalized input feature vector $x(n)$ to a hyperplane defined by the slope $\beta_i$ and bias $b_i$. The variable i here represents an index of the model. The present arrangement employs a 1 vs 1 approach in the multiclass classification problem, and thus the total number of models created is given by $P \cdot (P-1)/2$ where P is the number of classes (core events). The distances of each individual model are combined to provide an estimation of the class given the input feature vector $x(n)$ using an Error Correcting Output Codes (ECOC) approach as follows $$\hat{i} = \arg\min_i \frac{\sum_{p=1}^{P} |m_{ip}| \cdot \max(0, 1 - m_{ip} \cdot d_p)/2}{\sum_{p=1}^{P} |m_{ip}|}$$

where $m_{ip}$ is the element in the $i^{th}$ row and $p^{th}$ column of the coding matrix M. This matrix M only contains three different elements $\{-1, 0, 1\}$ where 0 indicates that signal sequences of the given class were not included in the training phase, and −1 and 1 indicate the label used in the training for the given class.

|  |  | Binary learners | |
| --- | --- | --- | --- |
|  |  | p = 1 | p = 2 |
| Classes | i = 1 (press) | 1 | −1 |
|  | i = 2 (long press) | 0 | 1 |
|  | i = 3 (tap) | −1 | −1 |

See for example "Error Correcting Output Codes for multiclass classification: Application to two image vision problems", IEEE 16$^{th}$ CSI International Symposium on Artificial Intelligence and Signal Processing.

The SVM classifier may be configured for incremental learning. In particular, the model defined in the classifier may be updated while it is being used, adapting to each user from a generic model to improve the final performance. This learning may be semi-supervised so it will learn from new estimations output by the SVM classifier (i.e. the model), given additional information indicating whether the estimations are adequate for model adaptation. The learning may also be (fully) supervised so that it will learn from new estimations output by the SVM classifier (i.e. the model) given known user inputs, or unsupervised so that it will learn from its estimations without using additional information.

In relation to supervised or semi-supervised learning, the controller 110B (or a separate applications processor) may be able to provide the additional information. For example, if a tap is triggered but in the given status of the device 100 that functionality is not supported, then it may be assumed that the estimation is wrong and not adequate for model adaptation. As another example, the device 100 may operate in a training mode when particular user inputs (core events) are invited.

In line with step 810 of method 800, the press/tap model stage 510 may be configured to detect gestures based on multiple classifications, for example occurring within a defined period of time. The SVM classifier may return core events which can be, as examples, a push/press, a long push/press or a tap. The event classifier operating in line with step 810 may then find gesture events such as a double tap or a double press. This occurs when two taps or two presses are detected in a given period of time.

Incidentally, the classification algorithm may be adapted when detecting gestures to make it more likely to detect the second and any subsequent core events of a gesture after detecting the first one. This may involve shifting (e.g. translating) the hyperplane concerned in the context of an SVM classifier. For example, after detecting a tap (as the first core event) the classification algorithm may be adapted to make it more likely (than before) that a second tap would be detected within a defined period of time given that it may be considered (highly) likely within that period of time that a user input would be a tap as part of a double-tap gesture. In the case of gestures involving more than two core events, the classification algorithm may be adapted after each subsequent core event is detected, given the increasing likelihood of such a gesture being intended. Similarly, after such a gesture has been detected, the classification algorithm may be adapted to make it less likely (than before) that a core event would be detected within a defined period of time given that it may be considered (highly) likely within that period of time that the user would be pausing before making further user inputs.

It was mentioned earlier that a classification algorithm, as well as recognising core events, could be used to recognise anomalies (i.e. unwanted user inputs). It will be understood that a classification algorithm could be trained and/or pre-configured to recognise both core events and anomalous events, or only one of them, and respond accordingly. In the case of core events, suitable indications could be provided to e.g. an applications processor for further processing (e.g. to control the device 100). In the case of anomalous events, the control may comprise changing a mode of operation, changing a sample rate, or disabling (or transitioning to a low-power mode) one or more functions/units as mentioned earlier.

To avoid complexity in the classification algorithm, it may be advantageous to provide one classification algorithm (implemented in the press/tap model stage 510) for detecting core events, and another classification algorithm (implemented in the anomaly detection stage 325) for detecting anomalous events. The classification algorithm for core events could operate in the button domain, and the classification algorithm for anomalies could operate in the sensor domain, in line with FIG. 3.

The classification algorithm (e.g. an SVM classifier) for anomalies could take sensor signals as its inputs (or extracted feature vectors), or for example the outputs of one or more preceding blocks configured to look for e.g. a negative average and a negative cross-correlation as mentioned earlier. Supervised, semi-supervised and unsupervised learning may be applicable as for the classification algorithm for core events. The present disclosure will be understood accordingly.

Adaptive Thresholding

As mentioned earlier, in some arrangements one or more threshold values are dynamically or adaptively set, for example any of the noise threshold TH noise, fall threshold TH fall, tap threshold TH tap and rise threshold TH rise.

Considering the noise threshold TH noise in particular in the running example, it may be possible in this way to simultaneously reduce the chances of false detection or non-detection of events and the power consumption of the force sense system.

Considering firstly false detection or non-detection, in order to detect impulsive or brief pushes such as taps, the detection threshold (e.g. TH noise) needs to be as low as possible otherwise there is the risk of not detecting such short events in a low sampling frequency mode (standby mode). On the contrary, if this threshold is too low the likelihood of false triggering events increases substantially. Considering secondly power consumption, it has been described above that in the running example a low sampling rate is adopted below the detection threshold (TH noise) and a high sampling rate is adopted above it. With power consumption in mind it is advantageous to reduce the time spent in the high frequency mode, which implies increasing the detection threshold.

A desirable detection threshold (TH noise) might be one that minimises the risk of false negatives whilst avoiding false positives. Such a threshold should not be lower than the noise present in the sensor signal, otherwise the noise itself will false trigger events. With this in mind, in one arrangement the noise power estimation stage 412 and adaptive thresholding stage 414 are configured to adaptively set this minimum threshold (TH noise) to a level derived from an estimate of the noise level in the sensor signal. This adaptive threshold also has a direct impact on the power consumption by reducing the likelihood of the system moving to the high sampling rate (active) mode when no event is present, as well as reducing the chances of false positives created by signal noise.

FIG. 9 is a flowchart presenting an example method 900 of adaptive threshold determination, comprising steps 902, 904 and 906, carried out by the noise power estimation stage 412 in combination with the adaptive thresholding stage 414.

In step 902, a sensor input signal is received. This signal may be a sensor signal derived from an individual sensor 130, or for example a combination of sensor signals derived from individual sensors 130. In another arrangement the sensor signal may be (in line with FIG. 3) a combination sensor signal representing a virtual button, as output by the sensor to button mapping stage 335.

In step 904 the noise level of the system is estimated by the noise power estimation stage 412, and in step 906 the noise threshold TH noise is set by the adaptive thresholding stage 414 based on this estimation. As indicated by the dashed arrow returning from step 906 to step 904, steps 904 and 906 may be carried out on an ongoing basis, i.e. adaptively setting the noise threshold TH noise based on the received sensor input signal.

Two example methods for adaptively setting the noise threshold TH noise in steps 904 and 906 will now be considered.

A first method comprises a recursive averaging (or recursive filtering) algorithm, to be carried out by the noise power estimation stage 412.

The recursive averaging algorithm effectively constitutes an IIR (Infinite Impulse Response) filter with two values for α that correspond to a fast rise and a slow fall to track the peak envelope of the noise λ(n), as follows:

$$\lambda(n) = [\lambda(n-1) \cdot p] + [\{\alpha \cdot \lambda(n-1) + (1-\alpha) \cdot |x(n)|\} \cdot \{1-p\}]$$

where p is a presence probability (the probability that a user input or "event" is present), x(n) is the current input and α is the forgetting factor.

To track the envelope two values of α used are as follows:

$$\alpha = \alpha_{fall} \text{ when } \lambda(n) > |x(n)|$$

$$\alpha = \alpha_{rise} \text{ when } \lambda(n) < |x(n)|$$

Using the two values of α leads to an asymmetric recursive averaging algorithm. Of course, these values could be set the same as one another, to allow for a symmetric recursive averaging algorithm.

The absolute value of the input is used to account for fast changes from negative to positive seen in corner cases such as when a long press is larger than sensor timeout or when force is applied next to a button and then released.

The adaptive noise threshold $TH_{noise}$ (TH noise) is calculated by the adaptive thresholding stage 414 by adding a bias $TH_{bias}$ to λ(n) and constraining the maximum value not to exceed $TH_{fall}$ (TH fall)

$$TH_{noise}(n) = \min(\lambda(n) + TH_{bias}, TH_{fall})$$

The minimum value is also constrained:

$$TH_{noise}(n)=\max(\lambda(n)+TH_{bias}, TH_{noiseMin})$$

In the first method, the presence probability is set to be either 0 or 1 as follows:

$$p=1, \text{ when } x(n)>TH\text{noise}(n-1)$$

$$p=0, \text{ when } x(n) \leq TH\text{noise}(n-1)$$

Thus, when p=1, the noise threshold TH noise can vary dynamically (on a sample-by-sample basis) based on the current value (and historical values) of the sensor signal x(n). Otherwise, when p=0, the noise threshold TH noise is maintained.

A second method is based on the first method but employs a mapping between a signal property and values of the presence probability p from 0 to 1, so that there is the potential for a (dynamically changing) combination between varying the noise threshold TH dynamically (which happens fully when p=1) and maintaining the noise threshold TH noise (which happens fully when p=0).

This can be appreciated by reconsidering the equation:

$$\lambda(n)=[\lambda(n-1)\cdot p]+[\{\alpha\cdot\lambda(n-1)+(1-\alpha)\cdot|x(n)|\}\cdot\{1-p\}]$$

For example, when p=0.5 it could be considered that there is a 50:50 mix or contribution between varying the noise threshold TH dynamically and maintaining the noise threshold TH noise.

The second method may for example involve calculating (on an ongoing basis) a signal property such as SNR (signal-to-noise ratio), and employing a mapping between SNR and the presence probability p so that the value of p varies with the SNR. Other signal properties could be determined instead, with corresponding mappings to the presence probability p.

The second method may be enhanced using a technique referred to as Improved Minima Controlled Recursive Averaging (IMCRA). In this respect, reference may be made to IEEE Transactions on Speech and Audio Processing, Vol. 11, No. 5, pages 466 to 475. The enhanced method may involve adding more than one iteration to search for the minimum in a buffer.

FIG. 10 shows a series of graphs of results where the above two example methods were tested, the first method referred to as RA (recursive averaging) and the second method using the IMCRA technique and referred to as IMCRA. In the experiment 5 dB of additive noise was applied to the system to assess the response of the noise tracking. The frame or sample number is displayed instead of time because the sample rate is variable, as mentioned earlier. There are five tap events in the low noise section, five in the high noise section and then five taps in the final low noise section.

It can be seen that using the first method (recursive averaging) leads to more false accepts in the high noise section because the noise tracking is less accurate than for the second method.

FIG. 11 relates to an estimate of the response time of the noise estimation, relating to the recursive averaging method. The recursive averaging noise variance estimate is based on a slow rise and a fast decay with bias.

By investigating the group delay of the rise and fall, IIR filter coefficients in the response time can be inferred as shown in FIG. 11. In particular, when the system is running in standby mode at 30 Hz it responds to a decrease in noise in 0.66 samples or 22 ms and an increase in noise in 19 samples or 633 ms. It can be appreciated from FIG. 10 that the second method employing IMCRA can be tuned to achieve a similar performance to the first (recursive averaging) method.

Inductive Sensing, Resistive-Inductive-Capacitive Sensing

It will be apparent that the above techniques are applicable for force sensing in general. Example types of force sensor mentioned above include capacitive displacement sensors, inductive force sensors, strain gauges, piezoelectric force sensors, force sensing resistors, piezoresistive force sensors, thin film force sensors and quantum tunnelling composite-based force sensors.

An example involving inductive sensing will now be considered, by way of example. The above techniques are applicable for example to enable dynamic accuracy in inductive sense systems. Systems and methods may reduce power consumption in inductive button sense systems by dynamically changing the measurement settings based on conditions in the system. Although the following considers inductive sense systems (e.g. employing a resistive-inductive-capacitive sensor), it will be appreciated that the considerations apply equally to other types of sensor system. The present disclosure will be understood accordingly.

Figure 12:
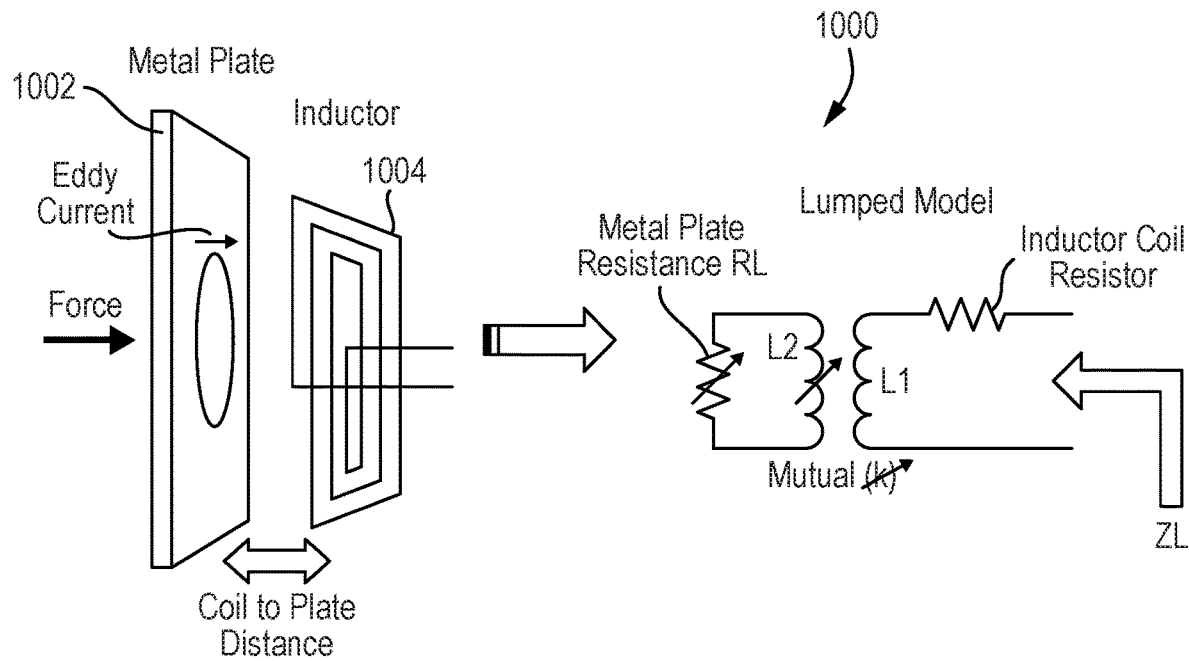
FIG. 12 is a schematic diagram of an example inductive sense system.

An example inductive sense system 1000 is shown in FIG. 12.

With reference to FIG. 12, inductive sensing consists of a metal plate 1002 and inductor 1004 located at a certain distance. When current (I) goes through the inductor 1004, the magnetic field induces Eddy current inside the metal plate 1002. When force is applied to the metal plate 1002, which changes the distance from the metal plate 1002 to the inductor coil 1004, and which changes the coupling between the inductor 1004 and metal plate 1002, the coupling coefficient k, inductor L2 and lossy resistance RL from the model changes. The change in distance, in turn, modifies the effective impedance looking into the inductor (ZL).

Figure 13:
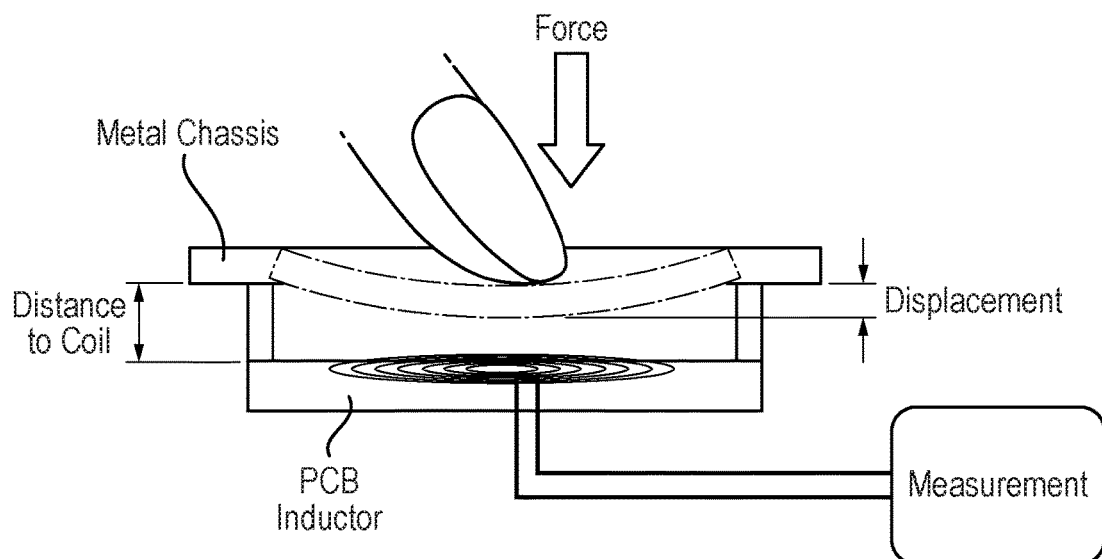
FIG. 13 is a schematic diagram of an example implementation of a button based on the system of FIG. 12.

In such an inductive sense system 1000, a force or mechanical movement in the metal plate 1002 will result in a change in inductance. This can be used to implement a button as shown in FIG. 13.

An example system 1100 that measures phase shift which is proportional to the coil inductance, and similar to those described earlier, is shown in FIG. 14.

Figure 14:
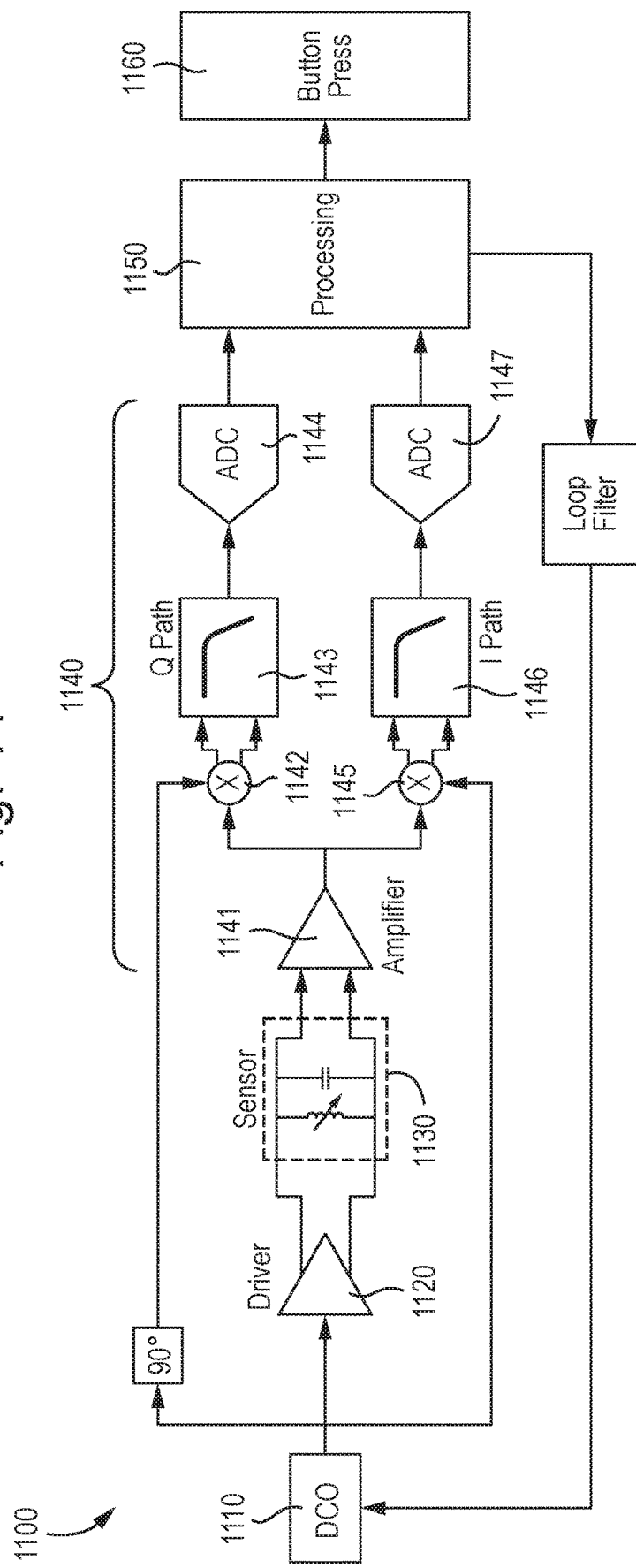
FIG. 14 is a schematic diagram of an example system that measures phase shift.

With reference to FIG. 14, the example system 1100 comprises a digitally controlled oscillator (DCO) 1110, a drive circuit (Driver) 1120, a sensor (Sensor) 1130, a Q-I receive path 1140, a processing block 1150 and a button press detection block (input determination block) 1160.

The DCO 1110 outputs a clock at a carrier frequency (Fc), referred to as the 0 degree output. The DCO 1110 outputs a second square wave clock that is notionally 90 degrees shifted relative to the primary output, referred to as the 90 degree output.

The output of the VCO (DCO) is coupled to the input of the driver 1120. The drive circuit 1120 drives a pseudo-sinusoidal current at the frequency and phase alignment of the 0 degree clock input. The drive circuit 1120 drives a fixed amplitude current.

The sensor (Sensor) 1130 in this example comprises an R-L-C circuit (corresponding to the sensor shown in FIGS. 12 and 13), and may be referred to as a resistive-inductive-capacitive sensor. The inductance in the circuit is comprised of a coil and a metal plate, for example the coil 1004 and the metal plate 1002. The voltage across the sensor 1130 is generated based on the R-L-C filter response to the current driven onto the sensor (alternatively the system may be responsive to voltage driven onto the sensor, to generate a current to be measured). The R component is not shown in FIG. 14 but will be present as an intentional or parasitic circuit component.

The Q-I receive path 1140 receives the voltage across the sensor 1130 and comprises a low noise input amplifier (Amplifier) 1141, an I path and a Q path. The Q path is coupled to the output of the amplifier 1141 and comprises an analog multiplier 1142 with inputs coupled to the VCO (DCO) output that is 90 degrees phase shifted to the current transmitted by the driver circuit 1120 and the output of the amplifier 1141, a low-pass filter 1143 coupled to the output of the analog multiplier 1142, and an ADC 1144 coupled to the output of the low pass filter 1143 to digitize the Q path voltage signal. The I path is coupled to the output of the amplifier 1141 and comprises an analog multiplier 1145 with inputs coupled to the VCO (DCO) output that is phase aligned to the current transmitted by the driver circuit 1120 and the output of the amplifier 1141, a low-pass filter 1146 coupled to the output of the analog multiplier 1145, and an ADC 1147 coupled to the output of the low pass filter 1146 to digitize the I path voltage signal.

The processing block (POST PROCESSING) 1150 generates amplitude and phase information from the Q-I paths wherein, the I path ADC output is coupled as an input into the processing block 1150, and the Q path ADC output is coupled as an input into the processing block 1150.

The button press detection block (input determination block) 1160 observes the phase information to determine if the shift in phase recorded by the I-Q detection path 1140 is interpreted as a button press.

In such a system, to do one scan of the R-L-C sensor 1130, the VCO (DCO) 1110 and drive circuit 1120 are activated. After the low pass filter 1143, 1146 has settled, the ADC 1144, 1147 is activated and one or multiple ADC samples are captured, nominally at 500 kHz (as an example). The duration over which the ADC samples are captured is referred to as the conversion time. Each ADC sample contains a certain amount of noise due to analog and digital factors including, but not limited to, circuit thermal noise, circuit flicker noise and digital quantization noise.

One or multiple ADC samples are filtered to attenuate noise, and processing converts the I and Q signals into phase and amplitude information.

Those skilled in the art will recognize that, while the filtering was described as occurring on the ADC inputs, it can occur at multiple places in the processing path such as on the ADC outputs.

The power in the system can vary based on a number of factors, such as scan rate, conversion time and drive current. If more scans are performed within a certain measure of time, the power will increase compared to less scans performed. Longer conversion times require the circuits to be active for a longer time, increasing power consumption. A higher drive current generated by the driver 1120 will provide a larger signal that increases the signal-to-noise ratio of the system, improving performance but increasing power consumption.

One possibility is to employ a fixed scan rate, conversion time, and drive current for a given setup. Against this backdrop, an improved system will now be considered, in which the system dynamically adjusts the scan rate, conversion time, and/or drive current (or one or more other system parameters) based on system conditions to minimize power consumption (or to meet a given performance target).

Figure 15:
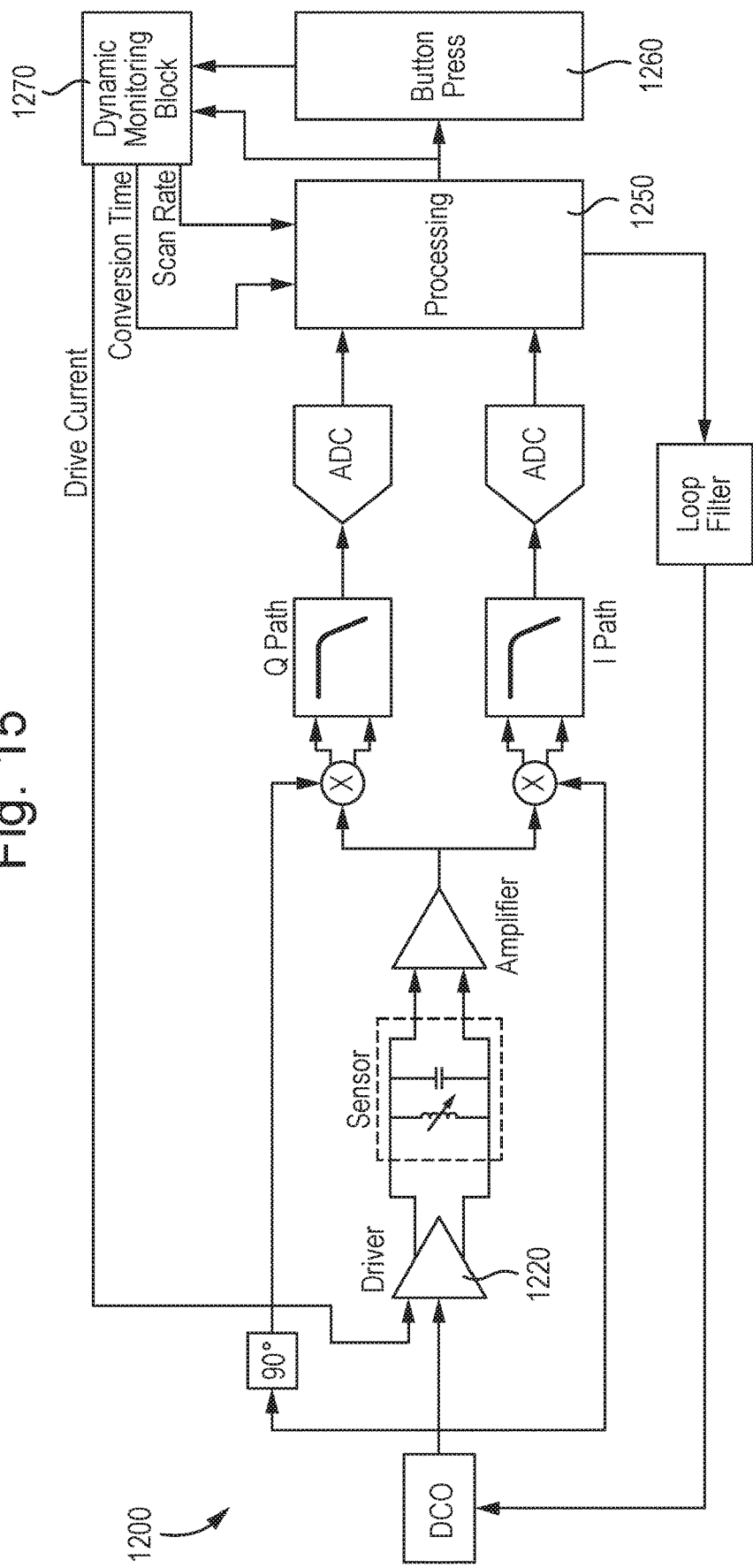
FIG. 15 is a schematic diagram of an example improved system that measures phase shift.

An example improved system 1200 is shown in FIG. 15, in a form similar to that of FIG. 14 for ease of comparison. The improved system of FIG. 15 comprises elements corresponding to those in FIG. 14 which are thus understood based on FIG. 14 and not considered further.

Beyond such elements the system 1200 comprises a dynamic monitoring block 1270. The drive circuit (Driver) 1220 corresponds to the drive circuit (Driver) 1120, the processing block 1250 corresponds to the processing block 1150, and the button press detection block (input determination block) 1260 corresponds to the button press detection block (input determination block) 1160.

The dynamic monitoring block (parameter control block) 1270 observes the state of the system (e.g. based on outputs of the processing block 1250 and/or the button press detection block 1260) and varies system parameters in response to the state of the system.

Monitoring can comprise, for example: the Q/I values (not shown in FIG. 15); the phase and amplitude outputs from the processing block 1250; and/or an intermediary state of the button press algorithm 1260. System parameters can comprise, for example: scan rate, conversion time, and/or drive current.

The system parameters (e.g. drive current of driver 1220, or conversion time or scan rate of processing block 1250) may be varied so that lower power modes are engaged when the phase signal is far away from triggering a system event and higher power modes are engaged when the system is closer to triggering a system event.

It will be understood that other arrangements may differ in terms of implementation from the above-described system as depicted in FIG. 15. For example, the DCO 1110 may be provided as a VCO, or as a DAC which may be driven by a digitally-generated sine wave.

In one arrangement, the dynamic monitoring block 1270 observes the distance between the measured phase value and the button press threshold. When the measured phase value is far away from the button press threshold the system may operate in a low-performance mode and when the measured phase value is close to the button press threshold the system may operate in a high-performance mode. Thus, the system may operate in different modes based on comparison with a threshold, in line with techniques described earlier herein.

Figure 16:
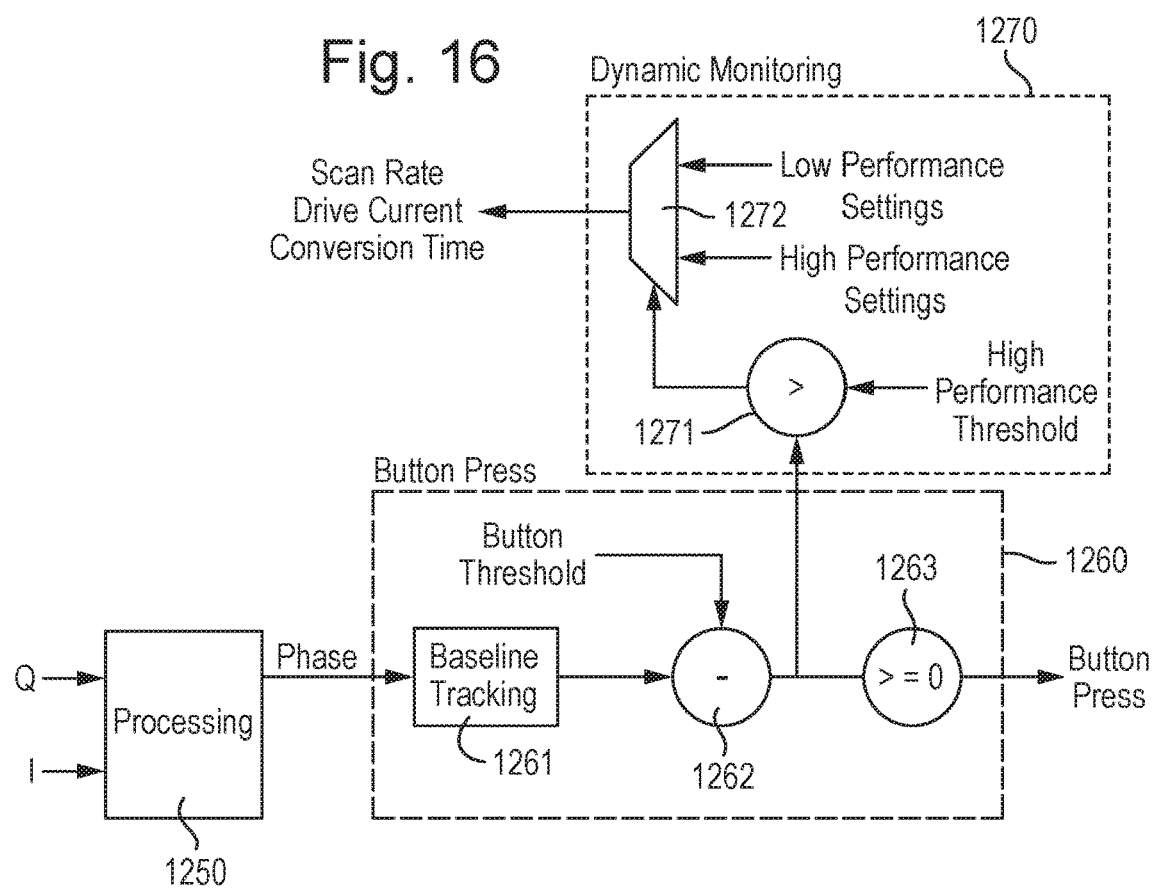
FIG. 16 is a schematic diagram of an example detailed implementation of parts of the FIG. 15 system.

An example such implementation of the FIG. 15 system is shown in FIG. 16 (in which only certain elements of the FIG. 15 system are shown for simplicity).

In the FIG. 16 embodiment a button press system event is deemed to occur when the measured phase (from the sensor) exceeds a button threshold. Moreover, high performance settings (system parameters) are used when the measured phase exceeds a high performance threshold, and low performance settings are used when the measured phase does not exceed the high performance threshold.

As shown in FIG. 16, the example button press algorithm comprises a baseline tracking function 1261 that high pass filters the raw phase output. In an example arrangement, the high pass filter is constructed from a 1st order high pass filter with a corner frequency of 1 Hz. The output of the baseline tracking is compared (e.g. by subtractor 1262) against a button threshold. If the baseline tracked output is above a button threshold (determined by comparison unit 1263), a button press system event is declared.

The dynamic monitoring block 1270 comprises (e.g. in storage) a set of high performance mode settings (system parameters), a set of low performance mode settings (system parameters), and a high performance mode threshold. Thus, there are different modes of operation with corresponding different system parameter settings.

A comparison is performed by unit 1271 between the high performance threshold and the distance between the button press and the button press threshold. The dynamic monitoring block 1270 outputs either the high or low performance mode settings based on the results of the comparison, for example using selector 1272. The settings may include scan rate, conversion time, or drive current. This operation can be better understood with reference to the example waveforms shown in FIG. 17.

Figure 17:
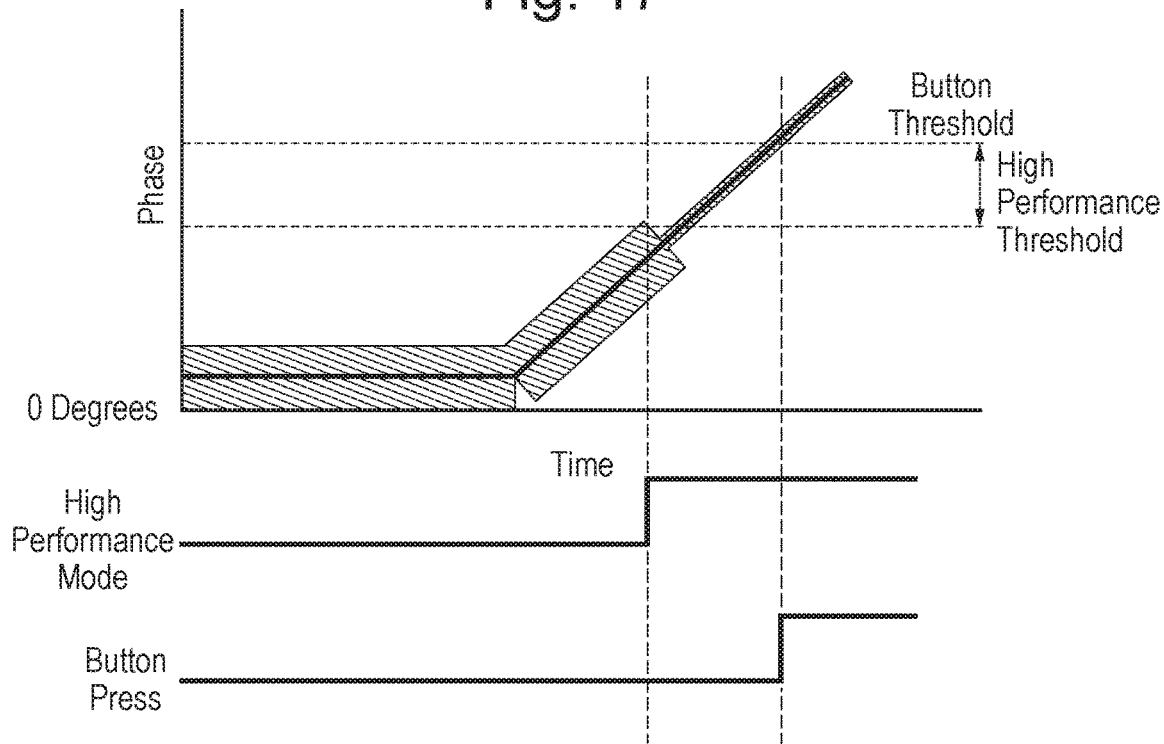
FIG. 17 presents waveforms useful for understanding FIGS. 15 and 16.

With reference to FIG. 17, a phase signal is shown vs time as a button press causes a shift in sensor coil inductance which causes a phase shift. The system noise is shown by the band of grey around the phase signal. When the High Perf threshold is hit, the high performance mode is entered. On entry into the high performance mode, the system noise decreases as indicated by the change (drop) in width of the band of grey, due to use of the high performance settings. Some time later, as indicated in FIG. 17, the button press threshold is crossed and a button press is asserted.

It is thus possible to drive a (programmable) current into the sensor. Dynamically varying this current drive has implications on noise, SNR and EMI. This can be generalized as varying the electrical signal that is driven into the sensor. It is also possible to have a programmable conversion time based on digital filtering. Dynamically varying conversion time directly varies phase accuracy. It is also possible to have a programmable scan rate, and to dynamically vary this too.

While an example has been shown, several system variations can of course exist based on this general teaching.

For example, while a single high performance threshold has been shown, this is one example. Multiple thresholds with different performance settings may be used. As another example, the performance settings may be a mathematical function of the distance between the phase signal and the button press threshold.

As another example, while the closeness to triggering a button press was used to decide when to engage, this is one example. High performance mode may be selectively engaged or disengaged based on the amplitude signal instead of the phase signal. High performance mode may be engaged if the input signal has deviated from a stable operating condition. This may be implemented by taking the derivative of the signal and comparing the derivative against a window or range.

As another example, while the system has been described as an inductive sense system, this is just an example. A system with a variable capacitor would result in similar electrical characteristics shifts in sensor. Possible system implementations are not required to assume that inductance shifts caused the change in sensor characteristics.

As another example, while the inductive sense system has been described as a fixed frequency driver and an I-Q receive path that measures phase and amplitude, this is an example. Changes in the R-L-C circuit may be measured by operating the R-L-C circuit as an oscillator and measuring the frequency of oscillation.

In overview, a system generally in line with the above may be considered to comprise: an inductance to digital system that digitally converts an inductance shift into a digital value; a processing block that interprets the digital value into a system event; and a dynamic monitoring block that monitors system state relative to a system event; wherein system configuration parameters are adjusted based on the digital value's distance from triggering a system event. The processing block that interprets the digital value into a system event may be a button detection block. The system event may be a button press. The system configuration parameter that is adjusted may be the scan rate, or the conversion time or the drive current, or any combination of these.

It will be apparent that such systems with inductive sensors are one example which demonstrates that thresholds as described earlier can be used to control how the system operates, including system parameters (which affect performance), sampling rates, and which units or stages are active or inactive (or in a low power state). The teaching of FIGS. 12 to 17 may thus be applicable to practical implementations of the controller 110, 110A or 110B.

Force Sense Direct Access Mode

Figure 18:
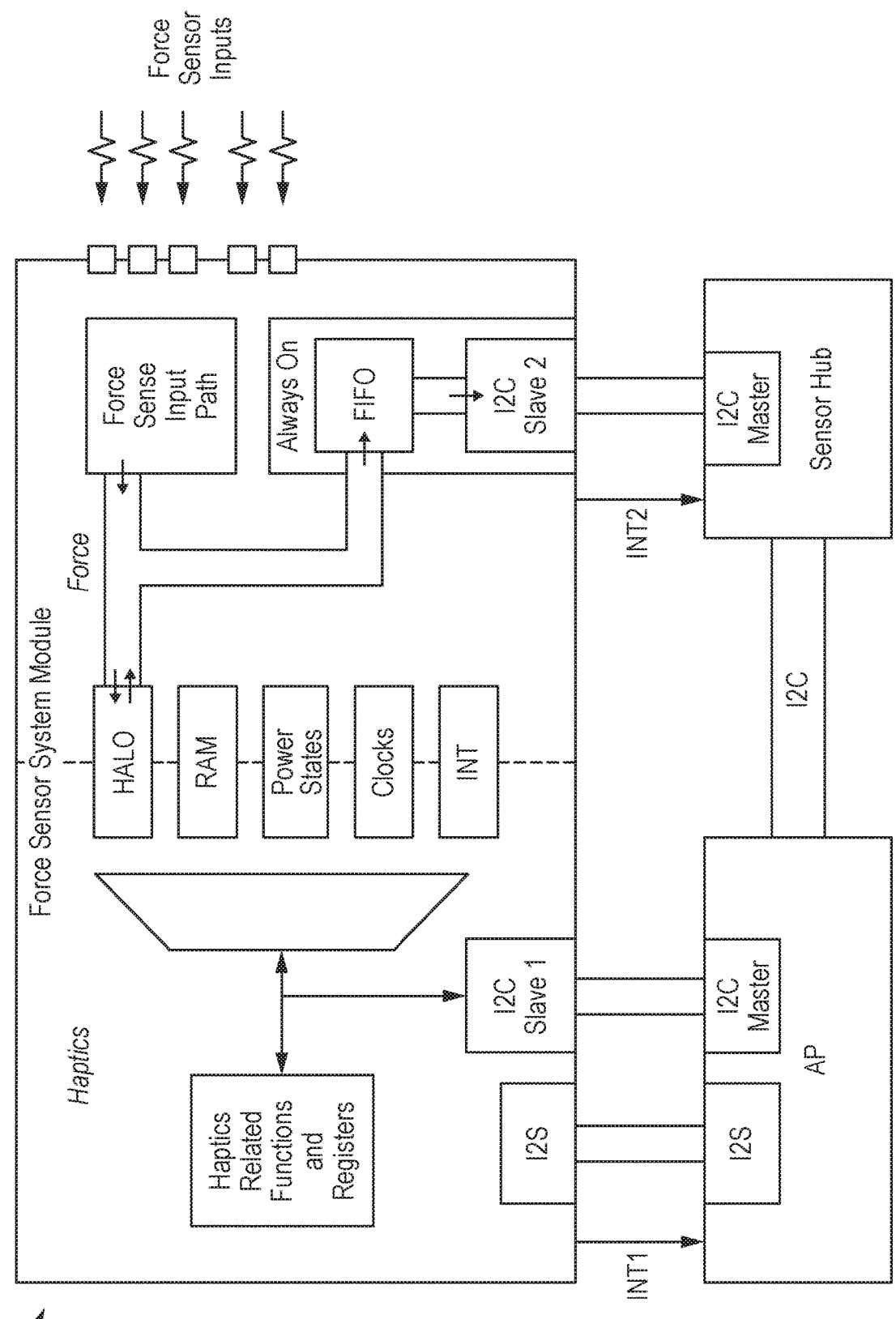
FIG. 18 is a schematic diagram of a controller of a force sensing system for use in the device of FIG. 1.

In a further aspect of the invention, and with reference to the attached FIG. 18, multiple force sensors may be provided in a device such as device 100, where the force sensors provide inputs to a central force sensor system module. The force sensor system module may be provided with multiple input paths, and suitable components such as at least one digital signal processing (DSP) core (HALO in FIG. 18), memory, clocks, interrupt modules, etc.

The force sensor system module may be arranged in communication with a central processing unit (CPU) or applications processor (AP) of the device 100. The force sensor system module may further be provided in communication with a sensor hub, which may further be in communication with a CPU or AP. The force sensor system module may provide further functionality, for example a haptics module for the control and operation of haptic outputs in the device 100.

The combination of the central force sensor system module, the applications processor (AP) and the sensor hub may be referred to as a controller 110C, and may be considered a practical implementation of the controller 110, 110A or 110B.

A Force Sense Algorithm is used to determine the occurrence of a user input based on the output of the force sensors. The Force Sense Algorithm may be provided in the sensor hub, and/or may be provided in the force sensor system module, e.g. in the HALO DSP core.

The following interfaces may provide the communications to and from the force sensor system module:

Primary I2C Slave

Used for configuring the force sensor system module. Configured to have access to the register space, and used by the Driver Software to configure various aspect of the Haptics functions and the Force Sense Input Path. For example:

Force Sense Input Path Configuration, including parameters relevant to the Analogue and Digital HW involved.

Force Sense Acquisition Rate.

Mode of operations.

Request for Signal Level (Re)Calibration.

FIFO Configuration.

Secondary I2C Slave

Used for obtaining direct information from the Force Sense Input Path, as per the configuration of the force sensor system module.

IRQ1

Used by the force sensor system module to indicate any interrupt requiring attention of the force sensor system module Driver SW.

IRQ2

Used to indicate that a new set of Force Sense Samples is available.

Operation

When operating the force sensor system module in Direct Access Mode the following steps may be performed:
1) The Driver configures the force sensor system module through the primary I2C interface.
2) The force sensor system module starts acquiring Force Sense Samples at each of the connected Force Sensors at the configured rate, e.g. @50 Hz.
   a. When a single set of Samples has been acquired, the Halo DSP Core writes these samples in a FIFO and raises IRQ2.
   b. The Sensor Hub (or equivalent function) extracts the data from the FIFO and clears the IRQ2.
3) The steps under 2) are repeated at the programmed acquisition rate.

Modes

The force sensor system module may be configured to operation in 3 modes, as part of the Direct Access mode.
A. Only raw samples are communicated through the FIFO and the Secondary I2C Interface
B. A Baseline Removal Filter (i.e. a high-pass filter with a very low-frequent pole) is applied on the raw samples before passing through to the Secondary I2C Interface.
C. Both Baseline Filter and an Activity Detect threshold are applied: Only when the signal (after removal of the baseline) exceeds a configurable threshold the latest set of force sense samples passed on through the secondary I2C Interface.

Recalibration

The force sensor system module may perform recalibration: Recalibration may be required under the rare condition that the input signal after DC offset removal exceeds the maximum input range of the AFE. In such condition the offset calibration needs to be performed again. Such condition may be performed when the accumulated contribution from aging, temperature drift and strong static forces exceed a threshold limit, e.g. 50N.

Recalibration can either be performed autonomously by the force sensor system module or can be initiated by the host through the primary I2C port.

Autonomous recalibration in combination with the Baseline Removal Filter is a preferred combination, but may be provided as an option that can be turned on or off.

The Sensor hub may be informed via the 2nd I2C interface when recalibration has been performed.

Configurability of the FIFO Messages

The format of the messages in the FIFO will be defined by the firmware running in the Halo Core. The messages in the FIFO may thus be defined in any way that suits the needs of the sensor hub best.

The above-described architecture allows the force sensor system module to power down after Force Sense Samples have been acquired. Only a small set of data bits (i.e. the FIFO) may be required for always on operation, which can be retrieved through the 2nd I2C interface and while keeping this FIFO safely separated from any other memory space in the device.

As apparent from FIG. 1, it will be understood that the controller 110 alone (force sensing system) as well as the device 100 comprising the controller 110 may embody the present invention. Corresponding methods and computer programs may also embody the present invention.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in the claim, "a" or "an" does not exclude a plurality, and a single feature or other unit may fulfil the functions of several units recited in the claims. Any reference numerals or labels in the claims shall not be construed so as to limit their scope.

The invention is not limited to the embodiments described herein, and may be modified or adapted without departing from the scope of the present invention.

The present disclosure extends to the following statements:

Event and Anomaly Detection

A1. A device, comprising:
at least one force sensor; and
a controller operable, in a classification operation, to determine whether a candidate input sensor signal derived from the at least one force sensor has a given characteristic.

Event Detection

A2. The device according to statement A1, wherein the classification operation comprises employing a classification model to determine whether a signal sequence extracted from the candidate input sensor signal belongs to one or more categories defined by the classification model.

A3. The device according to statement A2, wherein the controller is operable to:
generate a feature-based definition of the signal sequence by extracting at least one defined feature from the signal sequence; and
determine whether the signal sequence belongs to said one or more categories based on its feature-based definition.

A4. The device according to statement A3, wherein the feature-based definition comprises each feature extracted from the signal sequence, and optionally is a feature vector.

A5. The device according to any of statements A2 to A4, wherein the classification model is a support-vector machine model defined by a support-vector machine classification algorithm.

A6. The device according to statement A5, wherein the controller is configured to employ a supervised learning algorithm to define the classification model based on training data, the training data comprising a set of training signal sequences.

A7. The device according to statement A6, wherein the training data comprises the set of training signal sequences and information of the categories to which they belong.

A8. The device according to statement A6 or A7, wherein the supervised learning algorithm is a support-vector machine learning algorithm.

A9. The device according to any of statements A5 to A8, wherein the controller is operable to update the classification model based on a said signal sequence extracted from the candidate input sensor signal,
optionally based on the determination made by the classification operation concerned,
and optionally based on context information defining a context in which that signal sequence was obtained by the at least one force sensor.

A10. The device according to any of statements A5 to A9, wherein the classification model is a linear classification model or a non-linear classification model.

A11. The device according to any of statements A2 to A10, wherein the controller is configured to employ a support-vector clustering algorithm to define the classification model based on training data, the training data comprising a set of training signal sequences.

A12. The device according to any of statements A2 to A11, wherein the controller is operable to determine whether a defined core event or a defined anomalous event has occurred based on a said category to which the signal sequence is determined to belong.

A13. The device according to statement A12, wherein the controller is operable, if it is determined that a defined anomalous event has occurred, to:
operate in an anomaly mode; and/or
disable one or more functions; and/or
sample the force sensors at a given anomaly-mode sample rate; and/or
operate using anomaly mode system parameters.

A14. The device according to any of statements A2 to A13, wherein the controller is operable to carry out the classification operation for a set of said signal sequences extracted from the candidate input sensor signal in a given order.

A15. The device according to statement A14, wherein the controller is operable to determine whether a defined gesture event has occurred based on a combination of categories to which the plurality of said signal sequences are determined to belong,
optionally based on timings at which the plurality of signal sequences were obtained by the at least one force sensor and/or the at least one force sensor from which the plurality of signal sequences were obtained.

A16. The device according to statement A14 or A15, wherein the controller is operable, dependent on a category to which a first one of said extracted signal sequences in said order is determined to belong, to adapt the classification model for a second one of said extracted signal sequences in said order,
optionally wherein said classification model is adapted for the second one of said extracted signal sequences to:
increase a probability of the defined gesture event being determined to have occurred based on the first and second ones of said extracted signal sequences; or
increase a probability of the second one of said extracted signal sequences being determined to belong to a category whereby the first and second ones of said extracted signal sequences are determined to correspond to said defined gesture event.

Anomaly Detection

A17. The device according to statement A1, wherein the device comprises at least two force sensors, and wherein the candidate input sensor signal is generated by combining a plurality of input sensor signals derived from the force sensors.

A18. The device according to statement A17, wherein the candidate input sensor signal is generated by averaging the plurality of input sensor signals, optionally by averaging amplitudes of the plurality of input sensor signals on a sample-by-sample basis.

A19. The device according to statement A1, A17 or A18, wherein the classification operation comprises determining whether said characteristic is present on a sample-by-sample basis.

A20. The device according to any of statements A1 and A17 to A19, wherein the characteristic comprises the amplitude of the candidate input sensor signal being negative.

A21. The device according to any of statements A1 and A17 to A20, wherein the characteristic comprises the magnitude of the candidate input sensor signal being greater than a threshold value.

A22. The device according to any of statements A1 and A17 to A21, wherein the classification operation comprises employing a mapping function to map an amplitude of the candidate input sensor signal to a value within a predefined range of values.

A23. The device according to statement A22, wherein the mapping function comprises a sigmoid function.

A24. The device according to statement A1, wherein the device comprises at least two force sensors, and wherein the characteristic comprises a cross-correlation of a pair of input sensor signals derived from the force sensors being negative.

A25. The device according to any of statements A1 and A17 to A24, wherein the characteristic is that one or more signal features or signal statistics of the candidate input sensor signal deviate from a defined model.

A26. The device according to any of statements A1 and A17 to A25, wherein the classification operation is an anomaly detection operation, and wherein the controller is operable to determine that an anomaly is occurring if it is determined that the candidate input sensor signal has the given characteristic.

A27. The device according to any of statements A1 and A17 to A26, wherein the controller is operable to enter an anomaly mode of operation if it is determined that the candidate input sensor signal starts to have the given characteristic and to exit the anomaly mode of operation if it is determined that the candidate input sensor signal ceases to have the given characteristic.

A28. The device according to any of statements A1 and A17 to A27, wherein the controller is operable, if it is determined that the candidate input sensor signal has the given characteristic, to:
operate in an anomaly mode; and/or
disable one or more functions; and/or
sample the force sensors at a given anomaly-mode sample rate; and/or
operate using anomaly mode system parameters.

A29. The device according to any of the preceding statements, wherein the force sensors are located on the device according to anthropometric measurements of a human hand.

A30. The device according to any of the preceding statements, wherein each of the force sensors comprises one or more of:
a capacitive displacement sensor;
an inductive force sensor;
a strain gauge;
a piezoelectric force sensor;
a force sensing resistor;
a piezoresistive force sensor;
a thin film force sensor;
a quantum tunnelling composite-based force sensor;
an inductive sensor; and
a resistive-inductive-capacitive sensor.

A31. The device according to any of the preceding statements, wherein the controller is configured to control operation of the device based on an output of the classification operation.

A32. The device according to any of the preceding statements, comprising one or more input/output components, wherein the controller is configured to control operation of at least one of the input/output components based on an output of the classification operation.

A33. The device according to any of the preceding statements, being a portable electrical or electronic device such as a portable telephone or computer.

A34. A controller for use in a device comprising at least one force sensor, the controller operable, in a classification operation, to determine whether a candidate input sensor signal derived from the at least one force sensor has a given characteristic.

A35. A method of controlling a device comprising at least one force sensor, the method comprising, in a classification operation, determining whether a candidate input sensor signal derived from the at least one force sensor has a given characteristic.

A36. A computer program which, when executed on a device comprising at least one force sensor, causes the device, in a classification operation, to determine whether a candidate input sensor signal derived from the at least one force sensor has a given characteristic.

Adaptive Noise

B1. A device, comprising:
- at least one force sensor; and
- a controller operable, based on a candidate input sensor signal derived from the at least one force sensor to:
  - derive a noise threshold for use with the candidate input sensor signal based on a running estimate of the noise in that signal; and
  - control, based on a comparison between the candidate input sensor signal and the noise threshold derived for use with that signal, one or more of:
    - an operation mode of the controller;
    - a sample rate at which the at least one force sensor is sampled;
    - a system parameter such as a performance parameter; and
    - which of a plurality of units of the controller are disabled or operating in a low-power mode.

B2. A method of adaptively deriving a noise threshold for use with a given signal, the method comprising calculating the threshold based on a running estimate of the noise in the signal.

B3. The method according to statement B2, comprising recursively calculating the noise threshold based on current and previous values of the signal.

B4. The method according to statement B2 or B3, comprising calculating a current value of the noise threshold based on a combination of a previous value of the noise threshold and a current value of the signal.

B5. The method according to statement B4, wherein said combination is a sum such as a weighted sum.

B6. The method according to statement B5, wherein the weighted sum is defined by a first weighting when the values of the signal are falling and a second weighting different from the first weighting when the values of the signal are rising.

B7. The method according to any of statements B2 to B6, comprising constraining the threshold value within upper and lower limit values.

System Parameter Control

C1. A sensor system comprising:
- a sensor operable to generate a sensor signal indicative of a user input;
- an input determination block operable to determine whether a defined user input has occurred based on the sensor signal; and
- a parameter control block operable to control a system parameter based on the sensor signal so that operation of the sensor system is dependent on the sensor signal.

C2. The sensor system according to statement C1, wherein:
- the input determination block is configured to determine whether the defined user input has occurred based on the sensor signal and a user-input definition, optionally based on a comparison between the sensor signal and the user-input definition; and/or
- the parameter control block is configured to control the system parameter based on the sensor signal and a parameter-control definition, optionally based on a comparison between the sensor signal and the parameter-control definition.

C3. The sensor system according to statement C2, wherein the user-input definition comprises one or more of:
- at least one user-input threshold value;
- at least one user-input value range; and
- a user-input relationship defining an intended mathematical relationship between the sensor signal and the determination that the defined user input has occurred.

C4. The sensor system according to statement C2 or C3, wherein the parameter-control definition comprises one or more of:
- at least one parameter-control threshold value;
- at least one parameter-control value range; and
- a parameter-control relationship defining an intended mathematical relationship between the sensor signal and the system parameter.

C5. The sensor system according to any of statements C2 to C5, wherein the parameter-control definition defines when the system parameter should be controlled to cause the sensor system to operate in:
- a high-performance mode; and/or
- a low-performance mode; and/or
- each of a plurality of different performance modes.

C6. The sensor system according to any of the preceding statements, wherein:
- the input determination block is configured determine whether the defined user input has occurred based on a signal value derived from the sensor signal; and/or
- the parameter control block is configured to control the system parameter based on a signal value derived from the sensor signal.

C7. The sensor system according to statement C6, wherein the signal value comprises one or more of:
- an amplitude of the sensor signal;
- a Q or I component of the sensor signal;
- a phase of the sensor signal;
- a frequency of the sensor signal; and
- a derivative or integral or average or running average of an amplitude, phase or frequency of the sensor signal.

C8. The sensor system according to statement C6 or C7, wherein the parameter control block is configured to determine how close the signal value is to a value at which the input determination block would determine that a defined user input has occurred, and to control the system parameter based on the determined closeness.

C9. The sensor system according to any of statements C6 to C8, wherein:
- the parameter control block is configured to determine whether the signal value exceeds a threshold value, and to control the system parameter so as to have a first setting if the signal value exceeds that threshold value and a second setting different from the first setting if the signal value does not exceed that threshold value; and/or
- the parameter control block is configured to determine whether the signal value exceeds a plurality of different threshold values, and to control the system parameter so as to have different settings dependent on which of the different thresholds have been exceeded.

C10. The sensor system according to any of the preceding statements, wherein:
the input determination block is operable to transition through at least one intermediate state in determining whether the defined user input has occurred; and
the parameter control block is configured to control the system parameter based on the parameter control block transitioning through a particular said intermediate state or based on a current said state of the input determination block.

C11. The sensor system according to any of the preceding statements, wherein the system parameter controls one or more of:
a scan rate at which samples from the sensor are obtained or processed by the input determination block or the parameter control block;
a conversion time, being a period of time over which a sample from the sensor is captured for conversion into a digital sample;
an amplitude, phase or frequency of a drive signal used to drive at least one of the sensor, the input determination block and the parameter control block;
a voltage level of a supply voltage used to power at least one of the sensor, the input determination block and the parameter control block;
a clock frequency of a clock signal used to control at least one of the sensor, the input determination block and the parameter control block;
whether one or more components of the system are disabled or operated in a low-power mode;
whether signal filtering of the sensor signal is performed;
a signal-to-noise ratio of the sensor signal;
accuracy of the sensor system, or of the input determination block, or of the parameter control block;
whether a defined user input is determined to have occurred based on the sensor signal; and
power consumption of the sensor system.

C12. The sensor system according to any of the preceding statements, wherein the parameter control block is configured to control the system parameter based on the sensor signal on-the-fly or dynamically or on an ongoing basis or periodically or from time to time.

C13. The sensor system according to any of the preceding statements, wherein the sensor comprises one or more of:
a capacitive displacement sensor;
an inductive force sensor;
a strain gauge;
a piezoelectric force sensor;
a force sensing resistor;
a piezoresistive force sensor;
a thin film force sensor;
a quantum tunnelling composite-based force sensor;
an inductive sensor;
a resistive-inductive-capacitive sensor; and
a force sensor.

C14. The sensor system according to any of the preceding statements, comprising a plurality of said sensors, wherein:
the input determination block is operable to determine whether a defined user input has occurred for each said sensor, or for a group of said sensors; and/or
the parameter control block is operable to control a said system parameter based on the sensor signal per said sensor or for a group of said sensors so that operation of the sensor system per said sensor or for a group of said sensors is dependent on the sensor signal or signals concerned.

C15. A host device comprising the sensor system of any of the preceding statements, optionally being an electrical or electronic device or a mobile device.

C16. A method of controlling a sensor system, the sensor system comprising a sensor operable to generate a sensor signal indicative of a user input, the method comprising:
determining whether a defined user input has occurred based on the sensor signal; and
controlling a system parameter based on the sensor signal so that operation of the sensor system is dependent on the sensor signal.

C17. A computer program which, when executed on a sensor system comprising a sensor operable to generate a sensor signal indicative of a user input, causes the sensor system to carry out a method comprising:
determining whether a defined user input has occurred based on the sensor signal; and
controlling a system parameter based on the sensor signal so that operation of the sensor system is dependent on the sensor signal.

C18. A sensor system comprising:
a sensor operable to generate a sensor signal indicative of a user input;
an input determination block operable to determine whether a defined user input has occurred based on the sensor signal; and
a mode control block operable to control in which of a plurality of modes of operation the system operates based on the sensor signal.

C19. A sensor system comprising:
a sensor operable to generate a sensor signal indicative of a user input;
an input determination block operable to determine whether a defined user input has occurred based on the sensor signal; and
a parameter control block operable to control a system parameter based on the sensor signal so that the sensor system operates in:
either a high-performance mode or a low-performance mode dependent on the sensor signal; or
either a high-accuracy mode or a low-accuracy mode dependent on the sensor signal; or
either a high-power mode or a low-power mode dependent on the sensor signal.

The invention claimed is:

1. A force sensing system for determining if a user input has occurred, the system comprising:
an input channel, to receive an input from at least one force sensor;
an activity detection stage, to monitor an activity level of the input from the at least one force sensor and, responsive to an activity level which may be indicative of a user input being reached, to generate an indication that an activity has occurred at the force sensor; and
an event detection stage to receive said indication, and to determine if a user input has occurred based on the received input from the at least one force sensor,
wherein the force sensing system is configured in an anomaly-detection operation to determine whether an input from the at least one force sensor, or an average or other combination or cross-correlation of inputs from respective force sensors, has a characteristic indicative of an anomalous user input.

2. The system of claim 1, wherein the characteristic comprises the amplitude being negative and optionally the magnitude being greater than a threshold value.

3. The system of claim 2, configured in the anomaly-detection operation to employ a mapping function to map said amplitude to a value within a predefined range of values,
optionally wherein the mapping function comprises a sigmoid function.

4. The system of claim 1, configured to:
enter an anomaly mode of operation if it is determined that the input from the at least one force sensor, or the average or other combination or cross-correlation of inputs from respective force sensors, starts to have the characteristic; and
exit the anomaly mode of operation if it is determined that the input from the at least one force sensor, or the average or other combination or cross-correlation of inputs from respective force sensors, ceases to have the characteristic.

5. The system of claim 1, configured, if it is determined in the anomaly-detection operation that said characteristic is present, to:
operate in an anomaly mode; and/or
disable one or more functions; and/or
sample the at least one force sensor at a given anomaly-mode sample rate; and/or
operate using anomaly mode system parameters.

6. The system of claim 1, configured in the anomaly-detection operation to determine whether the input from the at least one force sensor, or the average or other combination or cross-correlation of inputs from respective force sensors, has the characteristic indicative of an anomalous user input by comparison against an anomaly-detection model which comprises a support-vector machine model defined by a support-vector machine classification algorithm.

7. The system of claim 1, wherein the system further comprises:
at least one force sensor, the output of the at least one force sensor coupled to the input channel to provide the received input.

8. The system of claim 7, wherein the at least one force sensor comprises one or more of the following:
a capacitive displacement sensor;
an inductive force sensor;
a strain gauge;
a piezoelectric force sensor;
a force sensing resistor;
a piezoresistive force sensor;
a thin film force sensor; and
a quantum tunnelling composite-based force sensor.

9. The system of claim 1, wherein the system further comprises:
a sensor conditioning stage, to perform conditioning of an input received from the input channel to provide a conditioned force sense signal, wherein the activity detection stage performs the activity level monitoring on the conditioned force sense signal.

10. The system of claim 9, wherein the sensor conditioning stage is configured to perform a baseline tracking of the input received from the input channel.

11. The system of claim 9, wherein the system is configured to receive inputs from multiple force sensors, optionally wherein the sensor conditioning stage is configured to determine an inverse correlation matrix of the inputs received from the input channel, to determine a sensor diagonalization of the inputs received from the input channel.

12. The system of claim 1, wherein the activity detection stage comprises a thresholding module, the thresholding module configured to determine if the activity level of the input from the at least one force sensor or of the conditioned force sense signal exceeds at least one threshold, wherein if the activity level exceeds the at least one threshold the activity detection stage determines that an activity has occurred at the force sensor.

13. The system of claim 12, wherein one said threshold is a noise threshold, and wherein the thresholding module is configured to derive the noise threshold adaptively based on a running estimate of noise in the input from the at least one force sensor.

14. The system of claim 12, wherein the thresholding module is further configured to perform at least one of the following:
compare the rate or rise and/or fall of the monitored signal against a corresponding rise threshold and/or a fall threshold indicative of an activity occurring at the sensor;
compare an active duration of the monitored signal against a minimum and/or maximum duration threshold indicative of an activity occurring at the sensor; and
compare the monitored signal against defined classified parameters to determine whether an activity has occurred at the sensor.

15. The system of claim 1, wherein the event detection stage comprises a comparison stage arranged to compare the received indication against a stored touch event model, and to determine if a user input has occurred based on the comparison.

16. The system of claim 15, wherein the touch event model comprises a support-vector machine model defined by a support-vector machine classification algorithm.

17. The system of claim 16, configured to employ a supervised learning algorithm to define the support-vector machine model based on training data and/or to update the support-vector machine model based on a determination made using the support-vector machine model and context information defining a context in which the input from the at least one force sensor concerned was obtained.

18. The system of claim 15, wherein the event detection stage is configured to determine based on the comparison against the touch event model whether the user input corresponds to a defined type of user input or a defined sequence of defined types of user input,
and optionally to output an indication of the defined type, or defined sequence of defined types, to which the user input corresponds.

19. A device comprising the force sensing system as claimed in claim 1, preferably wherein the device comprises a mobile phone or tablet device.

20. A device, comprising:
at least one force sensor; and
a controller operable, in a classification operation, to determine whether a candidate input sensor signal derived from the at least one force sensor has a given characteristic,
wherein:
the given characteristic comprises the amplitude of the candidate input sensor signal being negative and the magnitude of the candidate input sensor signal being greater than a threshold value;
the classification operation is an anomaly detection operation; and
the controller is operable to determine that an anomaly is occurring if it is determined that the candidate input sensor signal has the given characteristic.

* * * * *